US 12,453,296 B2

(12) United States Patent
Cohen et al.

(10) Patent No.: US 12,453,296 B2
(45) Date of Patent: Oct. 21, 2025

(54) PHASE-CHANGE MEMORY DEVICE WITH CONDUCTIVE CLADDING

(71) Applicant: International Business Machines Corporation, Armonk, NY (US)

(72) Inventors: Guy M. Cohen, Ossining, NY (US); Kangguo Cheng, Schenectady, NY (US); Juntao Li, Cohoes, NY (US); Ruilong Xie, Niskayuna, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 465 days.

(21) Appl. No.: 18/051,561

(22) Filed: Nov. 1, 2022

(65) Prior Publication Data
US 2024/0147874 A1    May 2, 2024

(51) Int. Cl.
*H10N 70/00*    (2023.01)
*H10N 70/20*    (2023.01)

(52) U.S. Cl.
CPC ......... *H10N 70/826* (2023.02); *H10N 70/063* (2023.02); *H10N 70/231* (2023.02); *H10N 70/8413* (2023.02)

(58) Field of Classification Search
CPC .................................... H10N 70/826
See application file for complete search history.

(56) References Cited

U.S. PATENT DOCUMENTS

| | | | |
|---|---|---|---|
| 7,390,691 B2 | 6/2008 | Dennison | |
| 7,750,335 B2* | 7/2010 | Clevenger | H10N 70/821 |
| | | | 257/4 |
| 8,026,543 B2 | 9/2011 | Song | |
| 8,183,551 B2 | 5/2012 | Kordus, II | |
| 8,623,697 B2 | 1/2014 | Magistretti | |
| 8,896,045 B2 | 11/2014 | Philipp | |
| 11,930,724 B2* | 3/2024 | Ok | H10N 70/063 |
| 12,010,930 B2* | 6/2024 | Ok | H10N 70/828 |
| 2007/0148855 A1* | 6/2007 | Chen | H10N 70/8828 |
| | | | 438/210 |

(Continued)

FOREIGN PATENT DOCUMENTS

CN    101226989 A    7/2008
EP    1801896 B1    5/2010

OTHER PUBLICATIONS

Cheng et al., "Wet-Etching Characteristics of Ge2Sb2Te5 Thin Films for Phase-Change Memory", IEEE Transactions on Magnetics, vol. 41, No. 2, Feb. 2005, 3 pages.

(Continued)

*Primary Examiner* — Mounir S Amer
(74) *Attorney, Agent, or Firm* — Edward J. Wixted, III

(57) ABSTRACT

A device structure for a phase-change memory device is disclosed. The device structure includes a top electrode, a phase-change material that is recessed between two layers of resistive liner material, and a conductive material. The conductive material contacts the sidewall of the top electrode, the sidewall of the phase-change material, and a portion of a top surface and a bottom surface of each of the two layers of the resistive liner material. The device structure includes a heater contacting a bottom electrode and the bottom layer of the resistive liner material. The heater is in a first bilayer dielectric. A second bilayer dielectric is under the top electrode.

15 Claims, 21 Drawing Sheets

(56) References Cited

U.S. PATENT DOCUMENTS

| | | | |
|---|---|---|---|
| 2008/0203374 A1 | 8/2008 | Chuo | |
| 2009/0101880 A1 | 4/2009 | Tu | |
| 2018/0205017 A1* | 7/2018 | Bruce | H10B 63/84 |
| 2022/0181547 A1 | 6/2022 | Ok | |
| 2022/0407000 A1* | 12/2022 | Yang | H10N 70/8616 |

OTHER PUBLICATIONS

Knotter et al., "Selective Si3N4 etch in Single Wafer Application", doi:10.4028/www.scientific.net/SSP.103-104.103, 5 pages.

Wu et al., "Three Terminal Phase Change Memory With Self-Aligned Contacts", U.S. Appl. No. 17/473,359, Filed Sep. 13, 2021, 32 pages.

International Searching Authority, "Notification of Transmittal of the International Search Report and the Written Opinion of the International Searching Authority, or the Declaration", File Reference F23W4897, International application No. PCT/CN2023/126461, International Filing Date Oct. 25, 2023, Mailed on Jan. 2, 2024, 7 pages.

* cited by examiner

PHASE-CHANGE MEMORY DEVICE WITH CONDUCTIVE CLADDING

BACKGROUND OF THE INVENTION

The present invention relates generally to the field of semiconductor device manufacture and more particularly to the formation of a phase-change device with a conductive cladding connecting the phase-change material to the top electrode.

Phase-change materials include various chalcogenide glass materials that can be used in semiconductor device applications, such as phase-change random access memory (PCRAM or PCM) and radio frequency (RF) switches. A phase-change material typically has at least two solid phases, a crystalline state, and an amorphous state. The transformation between these two phases typically can be achieved by changing the temperature of the phase-change material above the transition temperature of the phase-change material using electrical heating or optical pulses.

For many of the phase-materials, the amorphous state, exhibits a higher resistivity than in the crystalline state. In typical semiconductor switch applications, such as highly integrated radio frequency (RF) switches, when the phase-change material is in a low resistivity crystalline state, the switch is in an "ON" state and transmits signals, such as RF signals. Similarly, in typical semiconductor switch applications, when the phase-change material is in a highly resistive amorphous state, the switch is in an "OFF" state and does not transmit signals. A phase-change material, in a typical semiconductor application, may switch between numerous electrically detectable conditions of varying resistivities within a nanosecond time scale with the input of pico joules of energy. The optical and electronic properties can vary significantly between the amorphous and crystalline phases of the phase change material.

In typical memory applications, switching from the high-resistance or "reset" state, where part or all of the phase change material is amorphous, occurs when a current pulse is applied that heats the amorphous material above the crystallization temperature for a sufficiently long time for the material to crystallize. The switch occurs because the threshold switching effect leads to a drastic and sudden (within nanoseconds) reduction of the resistance of the amorphous phase when a certain threshold field is surpassed, at a given threshold voltage. Switching from the low-resistance or "set" state, where the phase change material is crystalline, is achieved by a high current pulse with a very short trailing edge. In typical PCM semiconductor applications, the current pulse heats the material by Joule heating, melts it, and enables very fast cooling (melt-quenching) such that the phase change material solidifies in the amorphous state. Since a phase change material permits reversible phase transformation in a typical case of a PCRAM device, the memory bit status can be distinguished by determining the state of phase change material in the memory bit.

SUMMARY

Embodiments of the invention provide a device structure for a phase-change memory device which includes a top electrode, a phase-change material that is recessed between two layers of a resistive liner material, and a conductive material. The conductive material contacts the sidewall of the top electrode, the sidewall of the phase-change material, and a portion of a top surface and a bottom surface of each of the two layers of the resistive liner material where the sidewall of the phase-change material is undamaged by directional etching of the phase-change material. The undamaged sidewall of the phase-change material provides a lower electrical contact resistance with the conductive material carrying the electrical signals to the top electrode than conventionally formed PCM devices that use directional etching of the phase-change material. Furthermore, the contact with an undamaged material reduces variability in the contact resistance across many devices. The two layers of the resistive material cover the top surface and the bottom surface of the phase-change material to reduce the effects of resistance drift that occurs in the amorphous state of the phase-change material and to protect the phase-change material during device formation. Embodiments of the device structure include a heater contacting a bottom electrode and the bottom layer of the resistive liner material. Embodiments of the present invention include a heater element for the PCM device that is in a first bilayer dielectric. Embodiments of the present invention include a second bilayer dielectric is under the top electrode.

Embodiments of the present invention provide a device structure for a phase-change memory device that includes a heater residing on a portion of a bottom electrode. Embodiments of the present invention include a device structure with a first dielectric material around a bottom portion of the heater and a recessed second dielectric material around a top portion of the heater. Embodiments of the present invention provide the device structure that includes a first resistive liner on the second dielectric material and a phase-change material recessed on a portion of the first resistive liner. The sidewall of the phase-change material is undamaged by directional etching processes used to form the shape of the phase-change memory device because a second etching process after the directional etching process recesses the sidewalls of the phase-change to remove the outer portions of the sidewall of the phase-change material that was damaged during the directional etching processes. Removing the damaged sidewall of the phase-change material improves the electrical performance of the completed phase-change memory device.

A second resistive liner is above the recessed phase-change material. The first and the second resistive liner protect the phase-change material from the semiconductor manufacturing processes used to complete the phase-change memory device. The first and second resistive liner extend beyond the sidewall of the recessed phase-change material. Additionally, the first and the second resistive liner can mitigate the effects of resistance drift occurring in the amorphous state of the phase-change material in the completed phase-change memory device.

Embodiments of the present invention disclose a third dielectric material on the second resistive liner where the third dielectric material is recessed on the second resistive liner. The third dielectric material is composed of a material with the same etch selectivity as the second dielectric material. Embodiments of the present invention provide a fourth dielectric material that is under a top electrode and above the third dielectric material. The device structure includes a conductive material contacting at least the sidewall of the top electrode, the undamaged sidewall of the phase-change material, portions of the first, second, third, and forth dielectric materials, and a portion of a top surface and a bottom surface of the first resistive liner, the second resistive liner. Embodiments of the present invention provide a device structure for a phase-change memory device with a thin layer of the phase-change material that provides a lower electrical contact resistance between the sidewall of the phase-change material and the conductive material connecting to the top electrode than conventional phase-change memory devices formed with a thin layer of the phase change material.

Embodiments of the invention provide a method of forming a device structure, the method includes a directional etch forming a pillar composed of a top electrode on a top bilayer dielectric, a phase-change material between a top resistive liner and a bottom resistive liner, a top dielectric layer of a bottom dielectric bilayer that is under the bottom resistive liner, wherein the directional etching forming the pillar damages a sidewall of the phase-change material. The method includes etching the exposed damaged sidewall of the phase-change material and conformally depositing a conductive material over the pillar, in the recess adjacent to the sidewall of the phase-change material, and over the top surface of the bottom dielectric material in the bottom bilayer dielectric. The method includes removing exposed horizontal portions of the conductive material. Conformally depositing the conductive material after etching the phase-change material to remove the damaged sidewall of the phase-change material provides a lower contact resistance for improved performance of the PCM device when completed. An etch process removes the exposed, horizontal portion of the conductive material but leaves a portion of the deposited conductive material adjacent to the sidewall of the recessed phase-change material. The method includes recessing a bottom layer of the top bilayer dielectric on the top resistive liner and the top layer of the bottom bilayer dielectric under the bottom resistive liner followed by conformally depositing another layer of a conductive material over the device structure. The method includes removing a portion of exposed horizontal surfaces of the conductive material deposited over the device structure. The remaining portion of the conductive material connects, at least, a portion of the top electrode to the conductive material between the two layers of the resistive liner to create a connection between the top electrode and the phase-change material.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
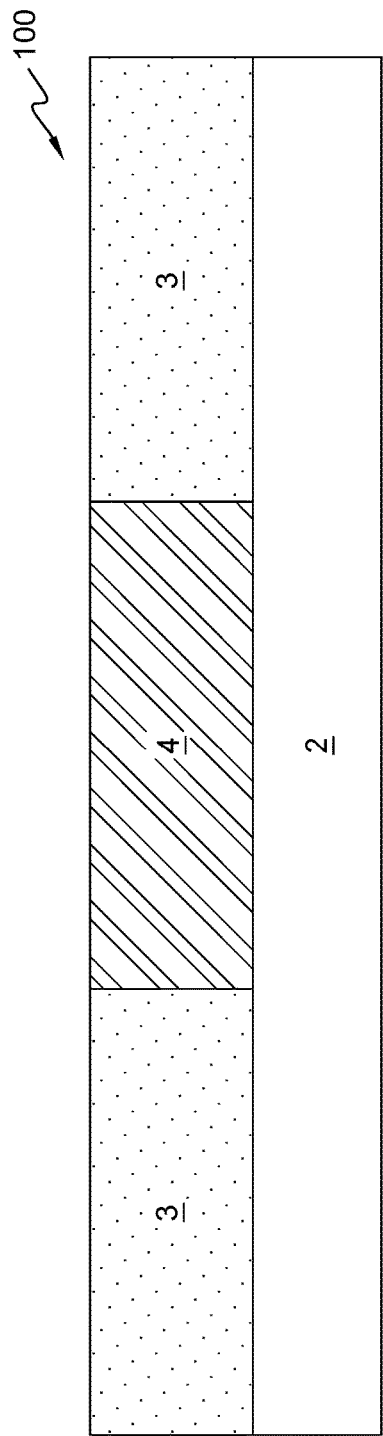
FIG. 1 depicts a cross-sectional view of a semiconductor structure after forming a bottom electrode in a first dielectric material on a semiconductor substrate in accordance with an embodiment of the present invention.

Embodiments of the present invention recognize that phase-change materials are increasingly used in integrated circuits (ICs). Embodiments of the present invention recognize that directional etching processes, such as reactive ion etch (RIE), used to pattern the phase-change memory (PCM) device, can damage the sidewalls of the phase-change material. The damaged sidewall of the phase-change material increases the electrical contact resistance between the phase-change material and any conductive material that contacts the damaged sidewall of the phase-change material. The increased contact resistance between the phase-change material and a conductive material, such as a conductive metal cladding or a resistive liner, that carries the read/write current from the phase-change material to the top electrode of the PCM device, degrades PCM device performance. Embodiments of the present invention recognize that providing an undamaged surface of the sidewall of the phase-change material contacting the metal conductor would improve the electrical performance of the PCM device.

Embodiments of the present invention recognize that improving the rate of phase transformations in the phase-change material would improve semiconductor device functionality. Embodiments of the present invention recognize that a trend in forming PCM devices using a thin layer of the phase-change material that has a thickness in the less than ten nanometer range is emerging. Embodiments of the present invention recognize that PCM devices formed with a thin layer of the phase-change material may reduce the reset current.

Embodiments of the present invention recognize that in conventionally formed PCM devices using a thin layer of the phase-change material, only a small contact area of the sidewall of the thin layer of the phase-change material is exposed to contact the metal contact or conductor carrying the electrical current from the phase-change material to the top electrode. In conventionally formed PCM devices created with a thin layer of the phase-change material, the contact area with the sidewall of the thin layer of the phase-change material with the metal conductor is especially small. The small contact area between the phase-change material and a conductor generates a significant amount of unwanted electrical contact resistance, especially when the sidewall of the phase-change material is formed using a directional etching process which damages the outer edges of the sidewall of the phase-change material. Embodiments of the present invention recognize that a PCM device that provides an undamaged sidewall of the phase-change material and a larger contact area for the contact of the phase-change material to the metal conductor would reduce the electrical contact resistance and improve the PCM device performance.

Embodiments of the present invention provide various structures for PCM devices and methods of forming the PCM device structures where the device structures provide both a lower electrical resistance path for read/write currents and more efficient, easier phase transformation of the phase-change material with a reduced volume phase-change material using a thinner layer of the phase-change material. Embodiments provide a larger direct contact area of the conductive material with the undamaged sidewalls of the phase-change material and portions of the surface of each of the resistive liners over and under the phase-change material. Embodiments of the present invention provide a device structure with the conductive material contacting a portion of the top surface, the bottom surface, and the sidewall of the phase-change material where the conductive material extends around and up a portion of the device structure to contact a portion of the sidewall of the top electrode. The larger contact area of the conductive material with the phase-change material improves the electrical performance of the PCM device. Embodiments of the present invention provide device structures that eliminate the damaged sidewalls of the phase-change material, increase the contact area of the conductive material carrying the electrical current from the phase-change material to a portion of the top electrode or from the resistive liner to the top electrode when the phase-change material is in an amorphous state. The contact of the conductive material with the undamaged sidewall of the PCM device and the ability to provide a larger contact area of the conductive material with the phase-change material improves the electrical performance of the resulting PCM devices.

Embodiments of the present invention provide lower contact resistance between the phase-change material and the conductive metal that dads or surrounds the phase-change material by creating an undamaged sidewall surface of the phase-change material that provides a lower electrical contact resistance with the conductive material contacting the phase-change material than the sidewall of a conventionally formed PCM device.

Embodiments of the present invention provide semiconductor structures where the resistive liner that is over and under the phase-change material protects the phase-change material during the processing steps, such as etching processes, used to form the completed PCM device. Embodiments of the present invention also provide semiconductor structures using one or two resistive liners to mitigate the effects of resistance drift occurring in the amorphous phase of the phase-change material. Embodiments of the present invention expose top and bottom surfaces of the resistive liners that extend beyond the phase-change material.

Embodiments of the present invention provide a layer of a recessed dielectric material above the top resistive liner and a layer of a recessed dielectric material below the bottom resistive liner to expose portions of the top surface of the top resistive liner and the bottom surface of the bottom resistive liner for increased contact area with the conductive material cladding the upper portion of the PCM device. When the phase-change material is in the high resistivity state (i.e., the amorphous state), then the electrical current runs through the resistive liner with lower electrical resistivity than the amorphous phase-change material. Embodiments of the present invention include a conductive material covering the exposed portions of the top surface of the top resistive liner and the bottom surface of the bottom resistive liner that surround the layer of the phase-change material (e.g., the resistive liners are above and under the layer of the phase-change material). In this way, the top surface of the top resistive liner and the bottom surface of the bottom resistive liner are in direct contact with the metal conductive material surrounding portions of the resistive liners, the sidewalls of the phase-change material, and the sidewalls of the top electrode.

Additionally, embodiments of the present invention provide a thin layer of the phase-change material in the PCM device. Using a thin layer of the phase-change material creates a smaller volume of the phase-change material to be heated by the heater element or cooled to the transition temperature of the phase-change material. The thinner layer of the phase-change material can be heated or cooled more quickly than a thicker layer to initiate a phase change of the phase-change material from the amorphous state to the crystalline state or vice versa.

Embodiments of the present invention provide a method of forming a device structure where the phase-change material is between two layers of resistive liner material. After directionally etching the phase-change material to form a pillar of the materials for the PCM device, where the directional etch process damages the surface of the phase-change material sidewall, the phase-change material is etched back using a suitable wet or dry etching process which removes the damaged surface of the sidewall of the phase-change material. A conductive material fills the recess between the two layers of the resistive liner to contact the undamaged sidewall of the phase-change material which improves the electrical contact resistance of the phase-change material with a metal conductive material.

Embodiments of the present invention disclose recessing the dielectric materials directly above and under the phase-change material and/or the resistive liner on the top and bottom surfaces of the phase-change material. Recessing the dielectric material directly on the phase-change material or on the resistive liners exposes a larger surface area of the phase-change material and/or the resistive liners on the phase-change material to contact the conductive metal connecting to the top electrode. The metal conductive material cladding sidewall of the phase-change material and the top electrode carries the read/write current to the top electrode of the PCM device.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration purposes only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating, or semiconductor layers at the interface of the two elements.

In the interest of not obscuring the presentation of embodiments of the present invention, in the following detailed description, some processing steps or operations that are known in the art may have been combined for presentation and illustration purposes and in some instances may have not been described in detail. In other instances, some processing steps or operations that are known in the art may not be described at all. It should be understood that the following description is rather focused on the distinctive features or elements of various embodiments of the present invention.

Deposition processes as used herein include but are not limited to chemical vapor deposition (CVD), plasma-enhanced chemical vapor deposition (PECVD), metal-organic chemical vapor deposition (MOCVOD), atomic layer deposition (ALD), ionized plasma vapor deposition (iPVD), plasma vapor deposition (PVD), gas cluster ion beam (GCIB) deposition, electroplating, but may not be limited these known semiconductor deposition processes.

Removing or etching as used herein may or may not include patterning using one of lithography, photolithography, an extreme ultraviolet (EUV) lithography process, or other known semiconductor patterning process that is followed by one or more of the etching processes. Various materials are referred to herein as being removed or "etched" where etching generally refers to one or more processes implementing the removal of one or more materials. In some cases, the removal of a material in an area occurs while leaving other protected areas of materials unaffected that are masked during the lithography processes. Some examples of etching processes include but are not limited to the following processes, such as a dry etching process using a reactive ion etch (RIE) or ion beam etch (IBE), a wet chemical etch process, or a combination of these etching processes. A dry etch may be performed using plasma. Plasma systems can operate in several modes by adjusting the parameters of the plasma. Ion milling, sputter etching, or reactive ion etching (ME) bombards the wafer with energetic ions of noble gases that approach the wafer approximately from one direction, and therefore, these processes are anisotropic or directional etching processes. Chemical mechanical planarization (CMP) is another known process of removing material using a combination of abrasive (polishing using an abrasive substance) and chemical processes to remove material from a top surface of a substrate.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so many of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. The present embodiments may use the terms device structure and semiconductor structure interchangeably. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout.

FIG. 1 depicts a cross-sectional view of device structure 100 after forming bottom electrode 4 on substrate 2 in accordance with an embodiment of the present invention. As depicted, FIG. 1 includes substrate 2, dielectric layer 3, and bottom electrode 4.

Substrate 2 may be composed of any semiconductor substrate material. In various embodiments, substrate 2 is silicon. In other examples, substrate 2 can be composed of a group IV semiconductor material, a group III-V semiconductor material, a group II-VI semiconductor material, a silicon on insulator (SOI), or other known semiconductor material used in semiconductor chips. In various embodiments, substrate 2 includes one or more semiconductor devices. For example, substrate 2 may include various front-end of the line devices such as field-effect transistors, isolation structures, contacts, or any other semiconductor device elements formed in a semiconductor wafer or semiconductor substrate. In some cases, substrate 2 does not always need to be a semiconductor substrate as its main function is providing mechanical support and/or a thermal path for cooling. For example, substrate 2 can be made of materials such as glass, and flexible materials used for flexible electronics.

Dielectric layer 3 resides on substrate 2. Dielectric layer 3 can be a layer of a dielectric material, deposited with known deposition processes. In various embodiments, dielectric layer 3 is composed of silicon nitride (SiN). In other examples, dielectric layer 3 can be composed of one or more dielectric materials, including but not limited to silicon dioxide ($SiO_2$), silicon carbide (SiC), silicon oxynitride (SiON), carbon-doped silicon oxide (SiOC), carbon doped silicon oxide (SiO:C), fluorine-doped silicon oxide (SiO:F), silicon-carbon-nitride (SiCN), boron nitride (BN), silicon oxycarbonitride (SiOCN), or any another suitable dielectric material used in semiconductor device formation.

Bottom electrode 4 may be formed of any conductive material used in semiconductor chip electrodes. In an embodiment, one or more semiconductor devices may reside under or adjacent to bottom electrode 4. Bottom electrode 4 can be formed, for example, using known patterning, etching, deposition, and CMP to create bottom electrode 4. Bottom electrode 4 may have a round shape, rectangular shape, or any other shape. Bottom electrode 4 in dielectric layer 3 may be composed of any electrode material such as but not limited to, copper (Cu), titanium nitride (TiN), tungsten (W), tungsten nitride (WN), tungsten carbide (WC), aluminum (Al) or multilayered stacks thereof.

Figure 2:
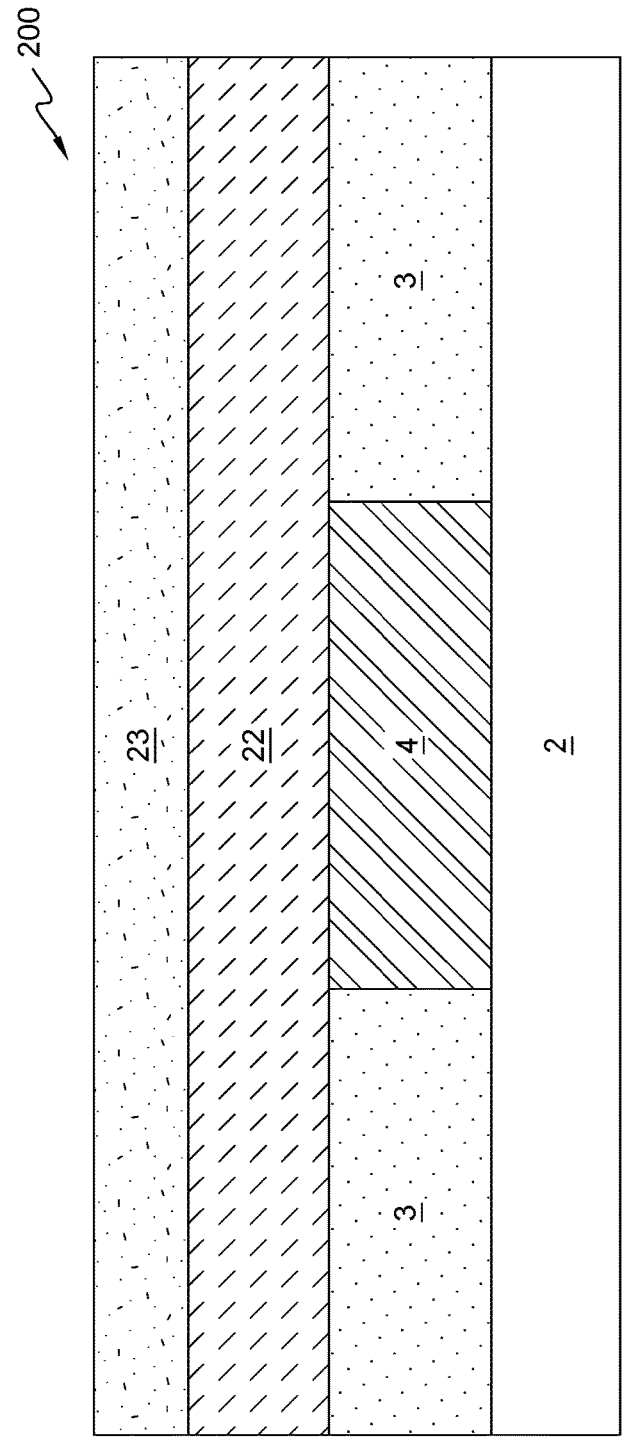
FIG. 2 depicts a cross-sectional view of the semiconductor structure after sequentially depositing a layer of two different dielectric materials on the exposed surfaces of the bottom electrode and the first dielectric material in accordance with an embodiment of the present invention.

FIG. 2 depicts a cross-sectional view of device structure 200 after depositing a layer of dielectric material 22 on the exposed surfaces of bottom electrode 4 and dielectric layer 3 and a layer of dielectric material 23 over dielectric material 22 in accordance with an embodiment of the present invention. As depicted, FIG. 2 includes the elements of FIG. 1 and dielectric material 22, and dielectric material 23. Dielectric material 22 and dielectric material 23 are deposited by one or more of the known dielectric material deposition processes (e.g., CVD, PVD, ALD, etc.).

Dielectric material 22 is deposited on the top surface of bottom electrode 4 and dielectric layer 3 can be any dielectric material. In various embodiments, dielectric material 22 is composed of a low-k dielectric material. For example, dielectric material 22 may be SiOCN, SiBCN, or another low-k dielectric material, but is not limited to these low-k dielectric materials and may be a dielectric material with a dielectric constant that is greater than 3.9. Dielectric material 22 and dielectric material 23 are materials that are compatible with the processes for forming a heater in phase change material (PCM).

Dielectric material 23 resides on dielectric material 22 and is composed of a different dielectric material. For example, dielectric material 23 can be composed of a nitride-based dielectric material such as SiN or may be an oxide-based dielectric material such as $SiO_2$ but is not limited to these dielectric materials. In various embodiments, the combination of dielectric material 22 and dielectric material 23 form a bilayer dielectric or a bilayer dielectric structure above bottom electrode 4 and dielectric layer 3. In an embodiment, only one layer of dielectric material is deposited on dielectric layer 3 and bottom electrode 4. For example, only dielectric material 22 is deposited.

In various embodiments, dielectric material 23 and dielectric material 22 are selected based on their etchant selectivity and etch rate. For example, an etchant for dielectric material 23 may not etch dielectric material 22. In other words, dielectric material 22 and dielectric material 23 are selected so that dielectric material 23 can be etched without removing dielectric material 22. Another consideration for selecting dielectric material 23 is that it would serve as a good stopping layer when polishing the heater material as will be further explained below.

Figure 3:
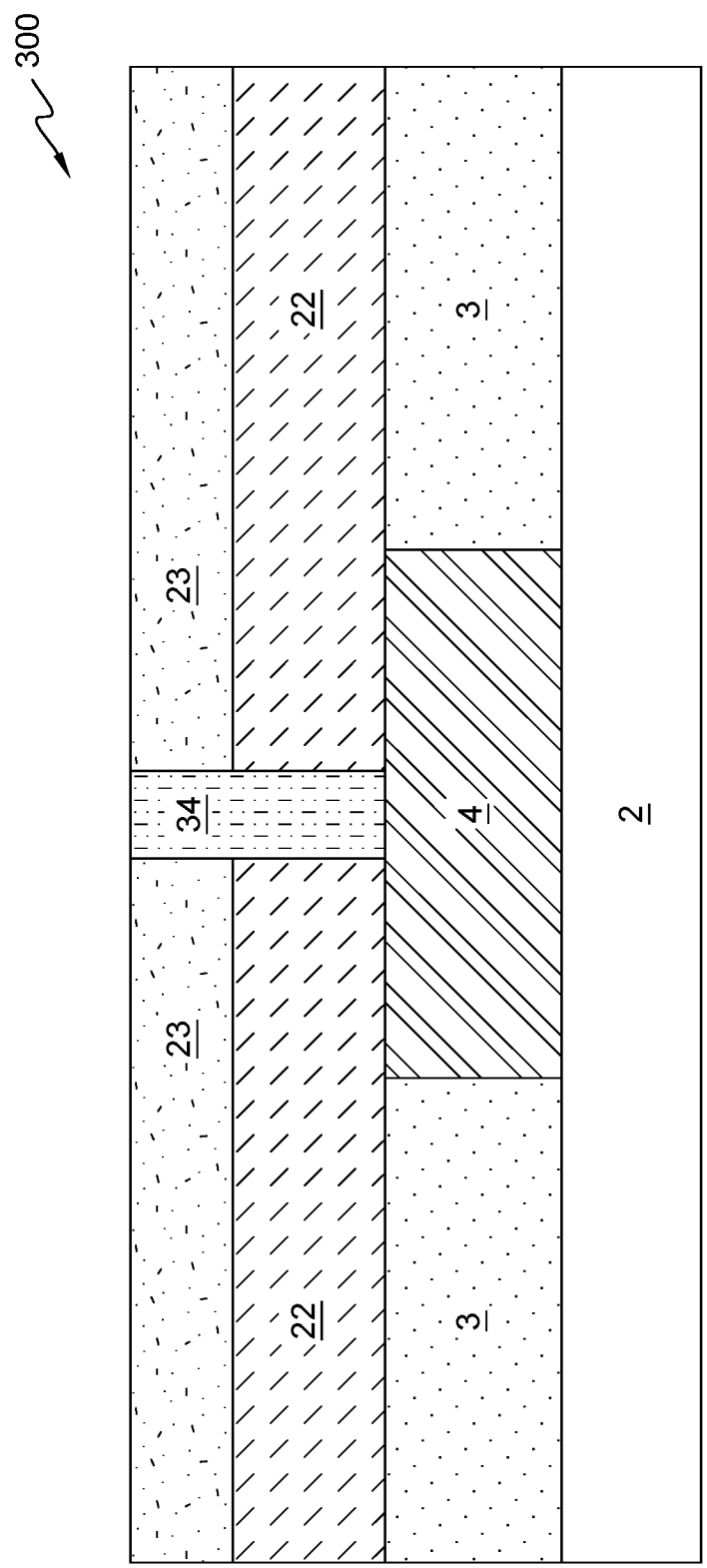
FIG. 3 depicts a cross-sectional view of the semiconductor structure after forming a heater on the bottom electrode in the layers of the two different dielectric materials in accordance with an embodiment of the present invention.

FIG. 3 depicts a cross-sectional view of device structure 300 after forming heater 34 on bottom electrode 4 in a portion of dielectric material 22 and dielectric material 23 in accordance with an embodiment of the present invention. As depicted, FIG. 3 includes the elements of FIG. 2 and heater 34. Using known processes (e.g., lithography, heater hole etching, heater material deposition, and CMP) for forming a heater for a PCM device, heater 34 is formed over a portion of bottom electrode 4 in a portion of the bilayer dielectric formed with dielectric material 23 and dielectric material 22, as depicted in FIG. 3.

Using a known deposition process such as CVD, PVD, ALD, MOCVOD, PECVD, or the like, a conducting material is deposited in the via to form heater 34. The conducting material for heater 34 can be a material such as but not limited to titanium nitride (TiN), tungsten (W), tantalum nitride (TaN), TiAl, or other similar resistive metal material. Heater 34 can include multiple different electrically conductive materials that can be arranged in multiple layers of materials (e.g., TaN/TiN/TaN). After filling the via with the conducting material, a CMP planarizes the top of device structure 300 and removes excess material for heater 34 from the top surface of dielectric material 23. A CMP can planarize the surface of device structure 300 and remove excess heater 34 material on the top surface of dielectric material 23. Alternatively, it is also possible to form heater 34 by depositing a blanket layer of material for heater 34 over surfaces of dielectric layer 3 and bottom electrode 4 before the deposition of layers 22 and 23. Pattern and etch the layer of material for heater 34 using lithography and RIE to form a pillar of the heater material. Then, the process includes depositing a layer of dielectric material 22 over the exposed surfaces. A CMP planarizes the top surface and then, dielectric material 22 can be recessed or etched back to expose a top portion of heater 34. In this example, dielectric material 23 may not be deposited over dielectric material 22.

Figure 4:
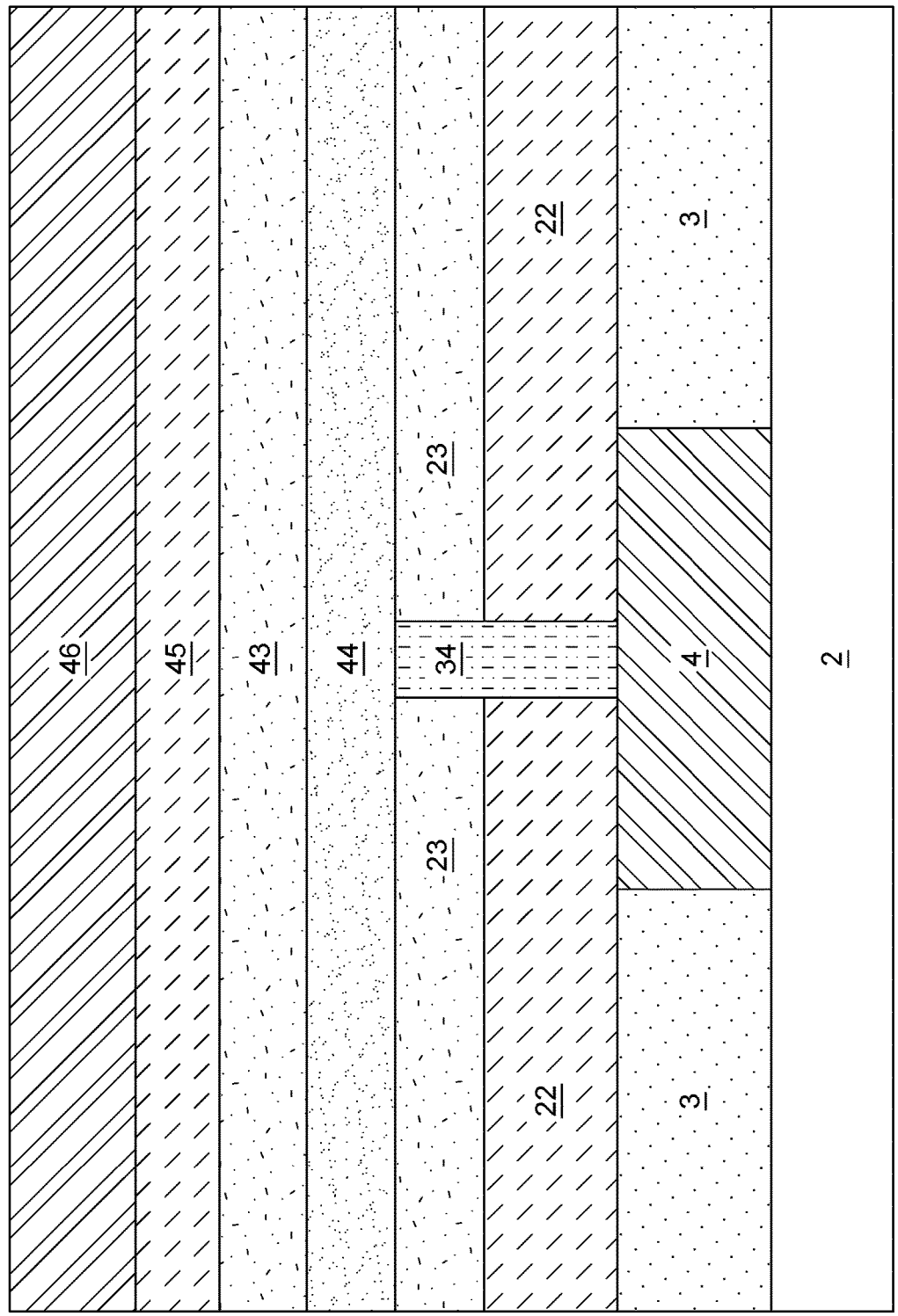
FIG. 4 depicts a cross-sectional view of the semiconductor structure after depositing a phase change material, two more layers of dielectric materials, and a layer of a top electrode material in accordance with an embodiment of the present invention.

FIG. 4 depicts a cross-sectional view of device structure 400 after depositing phase-change material 44, dielectric material 43, dielectric material 45, and top electrode 46 in accordance with an embodiment of the present invention. As depicted, FIG. 4 includes the elements of FIG. 3 and phase-change material 44, dielectric material 43, dielectric material 45, and top electrode 46. In various embodiments, dielectric material 43 and dielectric material 45 are composed of the same dielectric material as dielectric material 23 and dielectric material 22, respectively. However, dielectric material 43 and dielectric 45 are not limited to the same dielectric materials as dielectric material 23 and dielectric material 22 and maybe composed of other dielectric materials. The combination of dielectric material 43 and dielectric material 45 can also be known as a bilayer dielectric or a bilayer dielectric structure. In some examples, dielectric material 22 and dielectric material 45 can be composed of different dielectric materials. In these case, the thickness of dielectric material 22 and dielectric material 45 can be varied to achieve a similar amount of recessing (e.g., to get the same horizontal length of dielectric material 22 and dielectric material 45 removed after etching). Similar to dielectric material 23 and dielectric material 22, in various embodiments, dielectric material 43 and dielectric material 45 are selected based on their etch selectivity and etch rate. For example, an etchant for dielectric material 43 may not etch dielectric material 45. In an embodiment, only one layer of a dielectric material is deposited on phase-change material 44. For example, only dielectric material 43 is deposited.

In various embodiments, a layer of phase-change material 44 is deposited on the exposed top surfaces of dielectric material 43 and heater 34. For example, phase-change material 44 may be composed of germanium-antimony-tellurium (GeSbTe also known as GST) or a germanium-tellurium compound material (GeTe). Alternatively, other suitable materials for phase-change material 44 can include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys combinations thereof, or another phase-change material suitable for use in a PCM device. Phase-change material 44 may be undoped or doped (e.g., doped with one or more of O, N, Si, C, SiC, or Ti). A typical thickness of phase-change material 44 in device structure 400 can be 5 to 30 nm but is not limited to these thicknesses. Before the deposition of the phase change material 44 over the heater 34, the cleaning of the top surface of heater 34 may be performed (usually in situ) by sputtering the surface with ions (for example, using Ar sputtering).

As depicted in FIG. 4, the layer of electrode material for top electrode 46 is deposited on dielectric material 45. Top electrode 46 can be any electrode material (e.g., Cu, TiN, W, WN, WC, Au, etc. for a single layer or multilayered electrode) deposited using known electrode deposition processes (e.g., CVD, PVD, etc.). In various embodiments, top electrode 46 is composed of the same material as bottom electrode 4 but in other embodiments, top electrode 46 and bottom electrode 4 may be different electrode materials.

Figure 5:
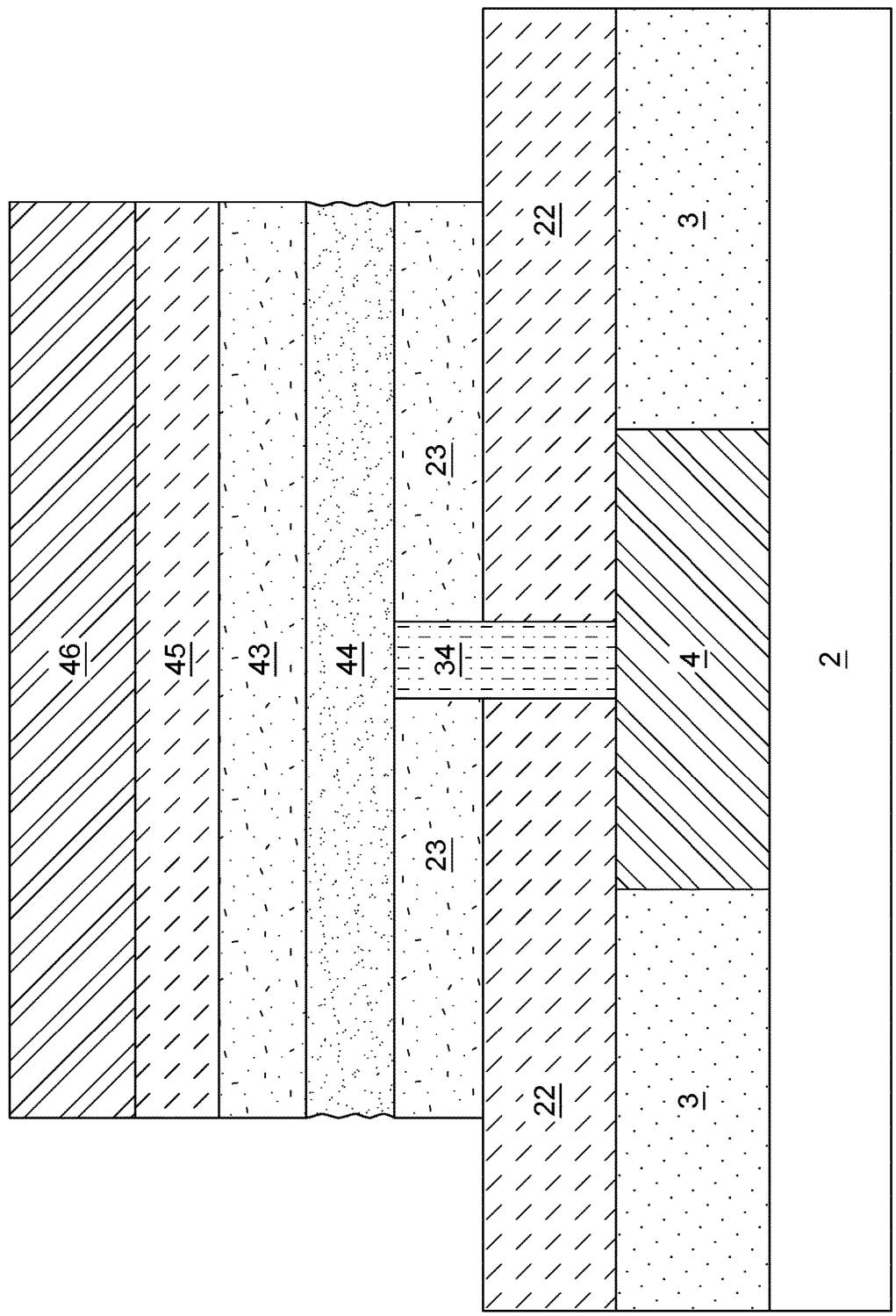
FIG. 5 depicts a cross-sectional view of the semiconductor structure after patterning the top electrode material and etching portions of the layers of the top electrode material, the two layers of dielectric materials on the phase change material, the phase change material, and the top dielectric material of the first layer of the first two dielectric materials in accordance with an embodiment of the present invention.

FIG. 5 depicts a cross-sectional view of device structure 500 after patterning top electrode 46 and etching exposed portions of top electrode 46, dielectric material 45, dielectric material 43, phase-change material 44, and dielectric material 23 in accordance with an embodiment of the present invention. As depicted, FIG. 5 includes the elements of FIG. 4 without portions of the layers of materials between and including top electrode 46 and dielectric material 23. After patterning the top surface of top electrode 46, the directional or anisotropic etching process, for example, using RIE, removes exposed portions of the layers of materials under top electrode 46, stopping at the top surface of dielectric material 22, to form a pillar above dielectric material 22. As depicted in FIG. 5, the pillar formed by the directional etching process includes the remaining portion of top electrode 46, dielectric material 45, dielectric material 43, phase-change material 44, and a top portion of heater 34 residing in the remaining portion of dielectric material 23.

As previously discussed, using a directional etching process, such as ME, damages the sidewalls of phase-change material 44. The wavey vertical lines along the vertical edges of phase-change material 44 illustrate the damage to the sidewall of phase-change material 44 caused by etching. The damaged surfaces of the sidewall of phase-change material 44 negatively impact the completed PCM device operation by creating a larger or higher electrical contact resistance between the metal spacer or metal cladding deposited later conducting current to top electrode 46 from the sidewall of phase-change material 44. It is important to note that the damage to the sidewalls of phase-change material 44 may be an increased surface roughness (as indicated by the wavey vertical lines), but in many cases, the damage consists of a change in the phase-change material composition. For example, depending on the ME chemistry, a $Ge_2Sb_2Te_5$ material may end up having a different than 2:2:5 Ge:Sb:Te elemental ratio at the surface of the phase-change material sidewall post etching with ME.

Figure 6:
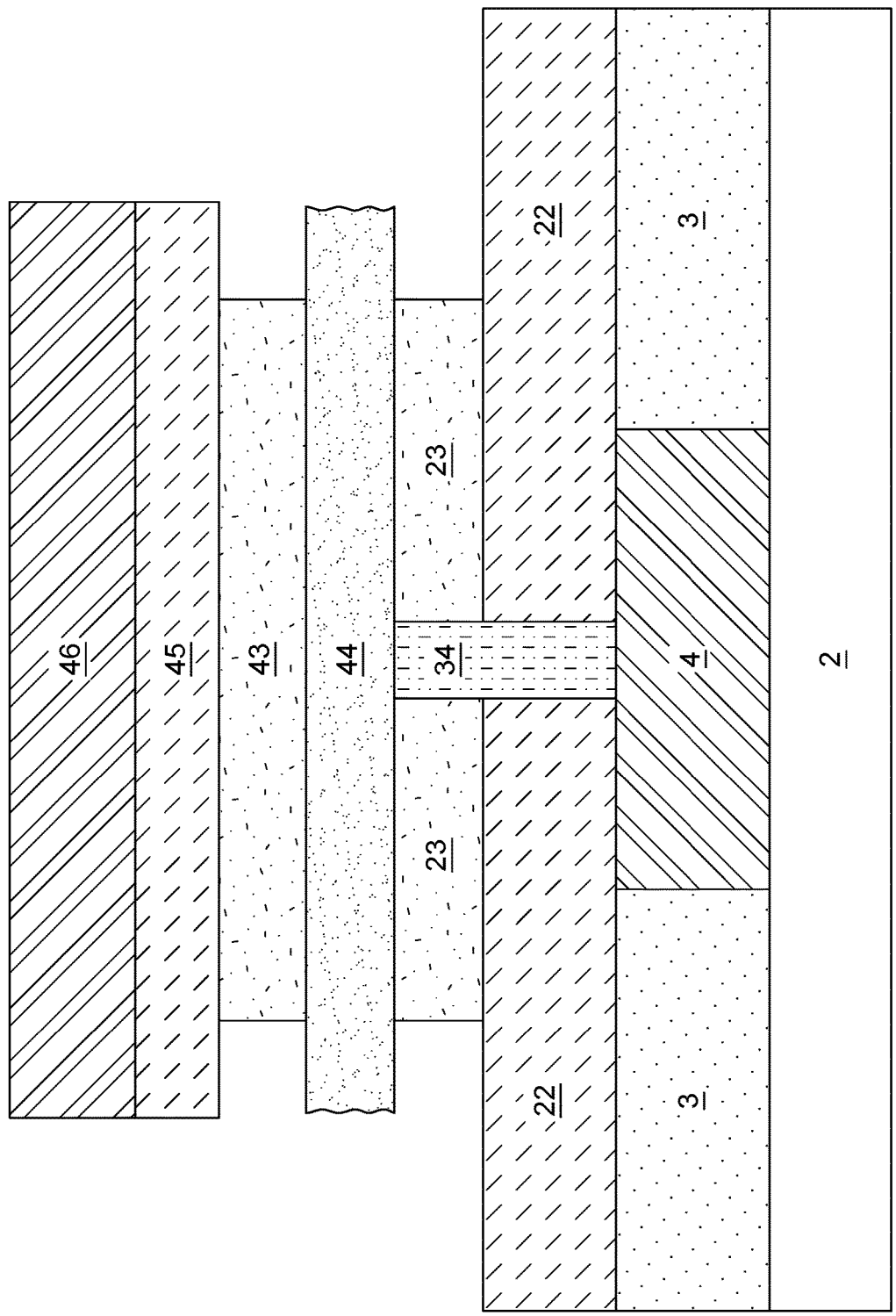
FIG. 6 depicts a cross-sectional view of the semiconductor structure after recessing the layer of the dielectric material directly over and under the layer of the phase change material in accordance with an embodiment of the present invention.

FIG. 6 depicts a cross-sectional view of device structure 600 after recessing the layers of dielectric material 23 and dielectric material 43 in accordance with an embodiment of the present invention. As depicted, FIG. 6 includes the elements of FIG. 5 without an outside portion of dielectric material 23 and dielectric material 43. In FIG. 6, the removed portions of dielectric material 23 and dielectric material 43 are directly under and over phase-change material 44, respectively.

For example, to create a small recess of the outer edges of each of dielectric material 23 and dielectric material 43 (e.g., in the range of 5 to 20 nm), a dry etching process, such as ME with zero bias, can be a near isotropic etch or a lateral etch to remove a small portion of dielectric material 23 under phase-change material 44 and a small portion of dielectric material 43 over phase-change material 44. When dielectric material 23 and dielectric material 43 are composed of the same material and have essentially the same thickness, the portions of dielectric material 23 and dielectric material 43 removed are the same or very similar (i.e., by removing the outer edges of dielectric materials 23 and 43, the recesses will essentially be the same and the etch back of each material extends the about same or the same lateral distance). The recessing of dielectric material 23 and dielectric material 43 can use one or more of various etching chemistries such as $CF_4$, $CHF_3$, and $NF_3$, with various mixtures of Ar, $O_2$, or $N_2$, However, as previously discussed above with GST as an example of phase-change material 44, a change in the composition on the surface of phase-change material 104 may occur which results in slightly different properties such as material transition temperature or melting point in the surface portion of phase-change material 44 adjacent to the removed portions of dielectric material 23 and dielectric material 43. In another example, using a wet etching process or a dry etching process, portions of dielectric material 23 and dielectric material 43 may be recessed when they are composed of the same dielectric material. For example, using a wet etching process with an ultra-diluted hydrofluoric (HF) acid as an etchant, using $H_3PO_4$ as an etchant, or a heated phosphoric acid as an etchant, the outer portions of the exposed sides or sidewalls of dielectric material 23 and dielectric material 43 may be removed. In some cases, a small portion of the exposed surfaces of phase-change material 44 may be affected by the wet etching process and the surfaces of the remaining portions of phase-change material 44 extending beyond the sidewall or vertical sides of dielectric material 23 and dielectric material 43 may be somewhat rounded, have a rougher surface (not depicted in FIG. 6) or have a slightly different composition.

In the cases where the surface of phase-change material 44 is slightly or somewhat damaged by the etching process used to recess dielectric material 23 and dielectric material 43, a higher electrical contact resistivity may occur in the effected surfaces of phase-change material 44, however, as depicted in FIG. 6, a larger contact area to the phase-change material 44 can offset the increase in the electrical contact resistance. In some cases, little to no damage of phase-change material 44 may occur after etching dielectric material 23 and dielectric material 43. In other cases, minimal to no damage occurs to phase-change material 44 during the sidewall etch or recessing of dielectric material 23 and dielectric material 43. As depicted in FIG. 6, after the etch of dielectric material 23 and dielectric material 43, a larger surface is exposed in phase-change material 44 for future contact with a conductive material that can connect to top electrode 46. As depicted in FIG. 6, after the selective etch of dielectric material 23 and dielectric material 43 exposes a portion of the top surface and a portion of the bottom surface of phase-change material 44, the selective etching additionally exposes the sidewall of phase-change material 44.

Overall, providing a larger exposed surface of phase-change material 44 can improve the electrical performance of the completed PCM device even if the exposed surface is slightly damaged or has a slightly altered surface composition (e.g., the larger contact area of phase-change material 44 with the metal spacer or conductive metal cladding connecting phase-change material 44 to the top electrode formed in later process steps may offset any small surface changes in phase-change material 44). The larger contact area with the phase-change material 44 in FIG. 6 is advantageous, especially with conventional PCM device structures with a thin layer of PCM material where the contact area to a conductor carrying the electrical current to top electrode 46 and the phase-change material occurs only at the sidewall of the thin layer of phase-change in conventional PCM devices (e.g., portions of the top surface and the bottom surface of phase-change material are not exposed in a conventional PCM device).

Figure 7:
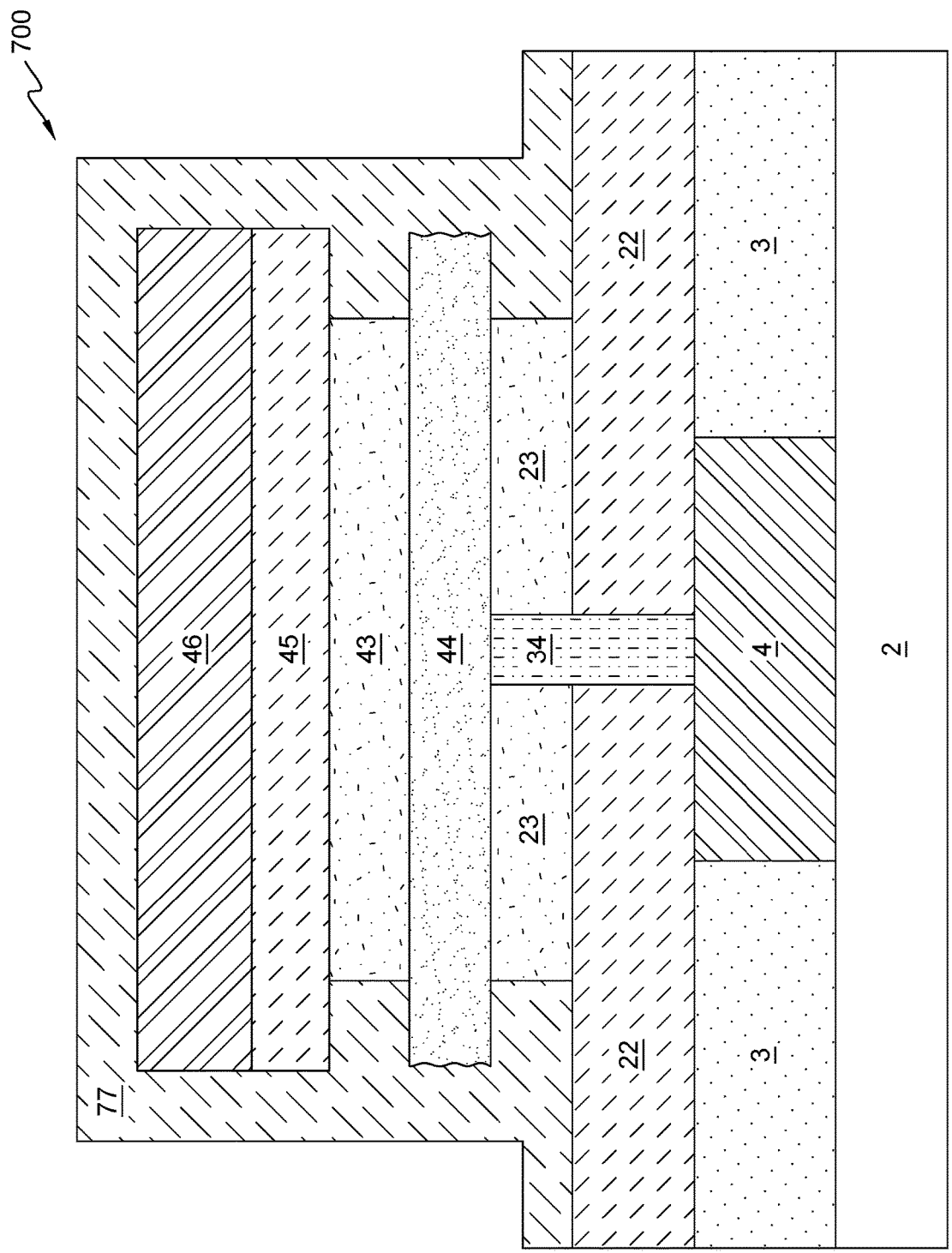
FIG. 7 depicts a cross-sectional view of the semiconductor structure after conformally depositing a layer of a conductive material in accordance with an embodiment of the present invention.

FIG. 7 depicts a cross-sectional view of device structure 700 after conformally depositing a layer of conductive material 77 in accordance with an embodiment of the present invention. As depicted, FIG. 7 includes the elements of FIG. 6 and conductive material 77. Conductive material 77 is conformally deposited over the top of the device structure filling the recesses adjacent to the sides of dielectric material 23 and dielectric material 43. As depicted in device structure 700, the exposed portions of phase-change material 44 contacting conductive material 77 include the sidewall, a portion of the top surface of phase-change material 44, and a portion of the bottom surface of phase-change material 44.

Conductive material 77 can be deposited over the exposed top surfaces of top electrode 46 and dielectric material 43 and along the vertical sides of dielectric material 23, phase-change material 44, dielectric material 43, and dielectric material 45 using a conformal deposition process such as ALD or CVD, for example. Conductive material 77 can be composed of TiN or any other conductive material or alloy used in PCM devices. Conductive material 77 can form a conductive cladding strap in the completed PCM device that will electrically connect phase-change material 44 to top electrode 46. Conformally depositing conductive material 77 in the recesses or notches formed by the selective isotropic etch process in FIG. 6 pinches off the recesses as the recesses fill with conductive material 77.

After the deposition of conductive material 77, as depicted in device structure 700, the exposed portions of phase-change material 44 contacting conductive material 77 include the vertical side or sidewall of phase-change material 44, a portion of the top surface of phase-change material 44, and a portion of the bottom surface of phase-change material 44.

Conductive material 77 surrounding portions of the top surface and bottom surface of the exposed portions of phase-change material 44 provides a larger contact area between phase-change material 44 and conductive material 77 than conventional PCM devices for current or electrical signals to travel through. The larger contact area of phase-change material 44 with the metal cladding formed by conductive material 77 can be especially advantageous in PCM devices formed with a thin layer of phase-change material 77. As previously discussed, conventional PCM devices formed with a thin, horizontal layer of the phase-change material only provide electrical contact with the conductive material connecting to the top electrode at the sidewall of the thin layer of the phase-change material (e.g., only a small contact area is provided by the sidewall the thin layer of the phase-change material in conventional PCM devices where the sidewall has also been damaged by the directional etching process). Device structure 700 increases the contact area between phase-change material 44 and conductive material 77 connecting to top electrode 46 compared to conventional PCM devices formed with a thin horizontal layer of phase-change material 44.

Figure 8:
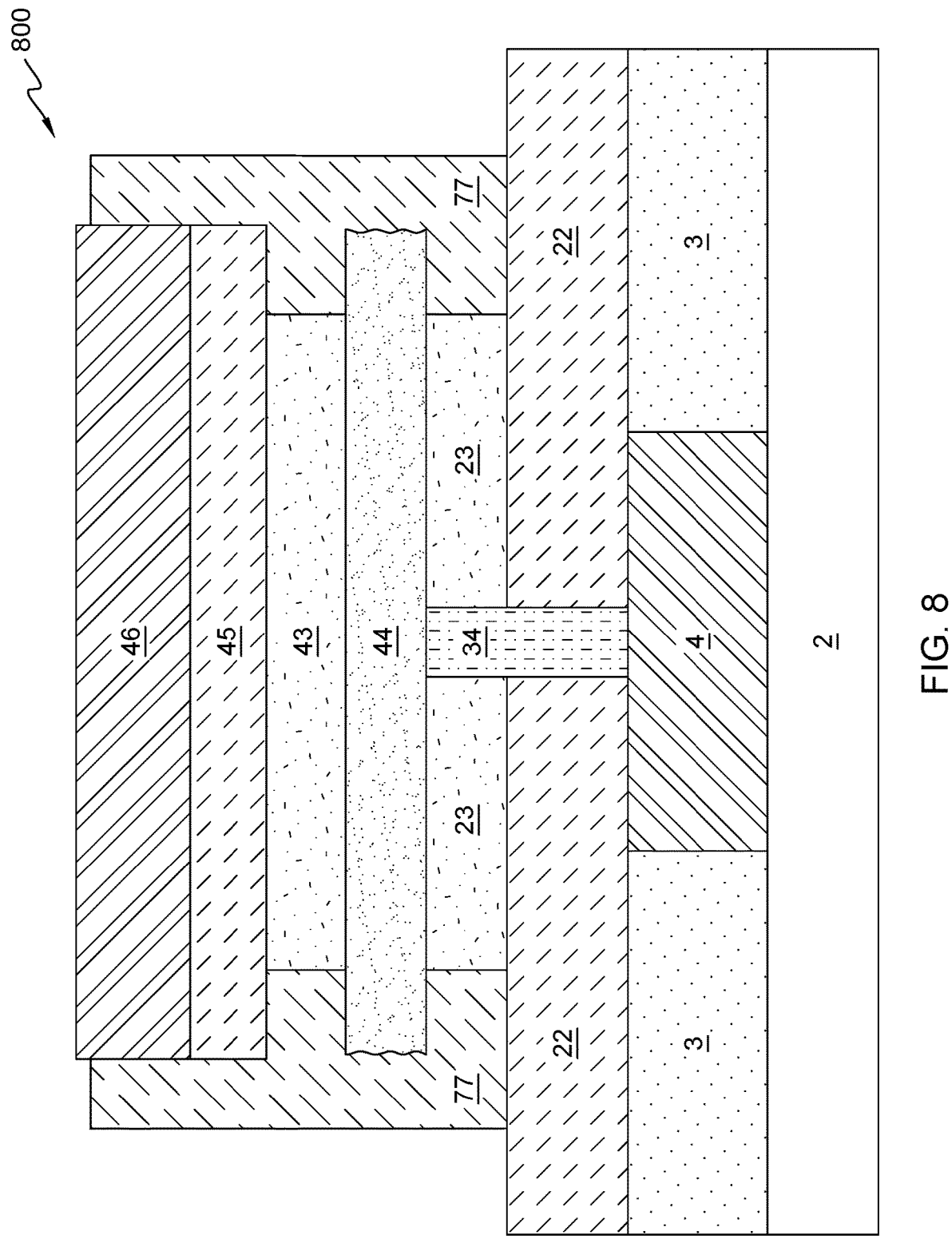
FIG. 8 depicts a cross-sectional view of the semiconductor structure after performing an anisotropic etching process to remove the exposed horizontal portions of the conductive material in accordance with an embodiment of the present invention.

FIG. 8 depicts a cross-sectional view of device structure 800 after performing an anisotropic etching process to remove the exposed horizontal portions of conductive material 77 in accordance with an embodiment of the present invention. As depicted, FIG. 8 includes conductive material 77, top electrode 46 under conductive material 77, dielectric material 45, dielectric material 43 on phase-change material 44, dielectric material 23, heater 34 contacting phase-change material 44 and bottom electrode 4, dielectric material 22, dielectric layer 3, and substrate 2 which can include various semiconductor devices. The horizontal portions of conductive material 77 can be removed during the etching process. For example, an RIE can remove horizontal portions of conductive material 77 exposing the top surface of top electrode 46 and dielectric material 22.

As depicted, the remaining portion of conductive material 77 after etching remains abutting the vertical sides of dielectric material 23, phase-change material 44, dielectric material 43, dielectric material 45, and a portion of top electrode 46. Conductive material 77 extends into the notches or recesses formed in FIG. 6.

In FIG. 8, conductive material 77 surrounds the exposed surfaces (i.e., top, bottom, and vertical sides) of the thin layer of phase-change material 44. Device structure 800 provides a larger contact area between phase-change material 44 and conductive material 77 than a conventional PCM device, especially a conventional PCM device formed with a thin layer of phase-change material where contact to the thin layer of the phase-change material only occurs at the vertical sides of the thin layer of the phase-change material. The larger contact area with a thin layer of phase-change material 44 to conductive material 77, which carries electrical current to top electrode 46, device structure 800 provides improved electrical performance for the completed PCM device even if some of the surfaces of phase-change material 44 may be slightly damaged during the etch of dielectric material 23 and dielectric material 43.

Device structure 800 with the undercut or recess of dielectric material 23 and dielectric material 43 respectively directly below or above the exposed portions of phase-change material 44 that extend beyond the sidewall of the remaining portions of dielectric material 23 and dielectric material 43 increases the contact area between conductive material 77 and phase-change material 44. While the increased contact area of phase-change material 44 can be especially advantageous with a PCM device formed with a thin layer of phase-change material 44, the increased contact area would also benefit other PCM devices with thicker layers of phase-change material 44. Increasing the contact area between phase-change material 44 and conductive material 77 may still decrease the contact resistance between phase-change material 44 and conductive material 77 even when the surface of phase-change material 44 may be slightly damaged by the etching process recessing dielectric material 23 and dielectric material 43. For example, the size or amount of the contact area of conductive material 77 with phase-change material 44, in some cases, may be increased as needed to compensate for any surface changes occurring in phase-change material 44 as a result of dielectric material 23 and dielectric material 43 recessing. Device structure 800 providing a larger contact area between phase-change material 44 and conductive material 77 can improve the electrical performance of the completed PCM device.

Figure 9:
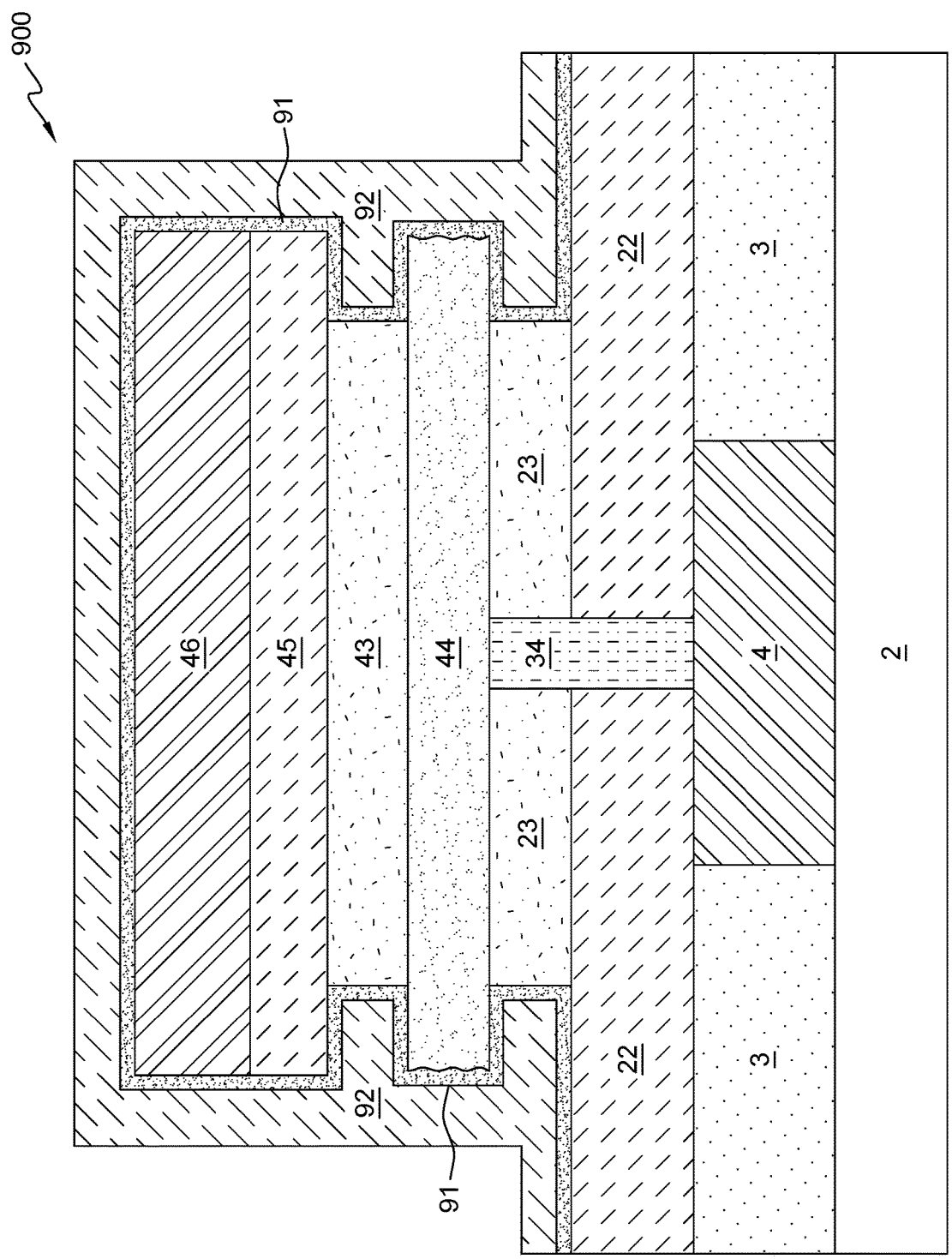
FIG. 9 depicts a cross-sectional view of the semiconductor structure after conformally depositing a layer of a liner material over the semiconductor structure of FIG. 6 and depositing a layer of conductive material over the liner material in accordance with an embodiment of the present invention.

FIG. 9 depicts a cross-sectional view of device structure 900 after conformally depositing a layer of liner 91 over device structure 600 depicted in FIG. 6 and depositing liner 91 and conductive material 92 over liner 91 in accordance with an embodiment of the present invention. As depicted, FIG. 9 includes the elements of FIG. 7 but conductive material 92 replaces conductive material 77, and liner 91 is added under conductive material 92.

Liner 91 can be composed of any known liner material used in PCM devices. For example, liner 91 may be composed of TiN or TaN but is not limited to these materials. Liner 91 is a relatively thin layer of the liner material that is deposited over the exposed portions of device structure 600 depicted in FIG. 6. Liner 91 and conductive material 92 can be conformally deposited, for example, by ALD or CVD.

Conductive material 92 can be composed of one or more of the same conductive materials as conductive material 77. In various embodiments, conductive material 92 is composed of tungsten but is not limited to tungsten. Conductive material 92, like conductive material 77, fills the recesses between liner 91 on phase-change material 44 and liner 91 on dielectric material 43 and dielectric material 23 as depicted in FIG. 9.

Figure 10:
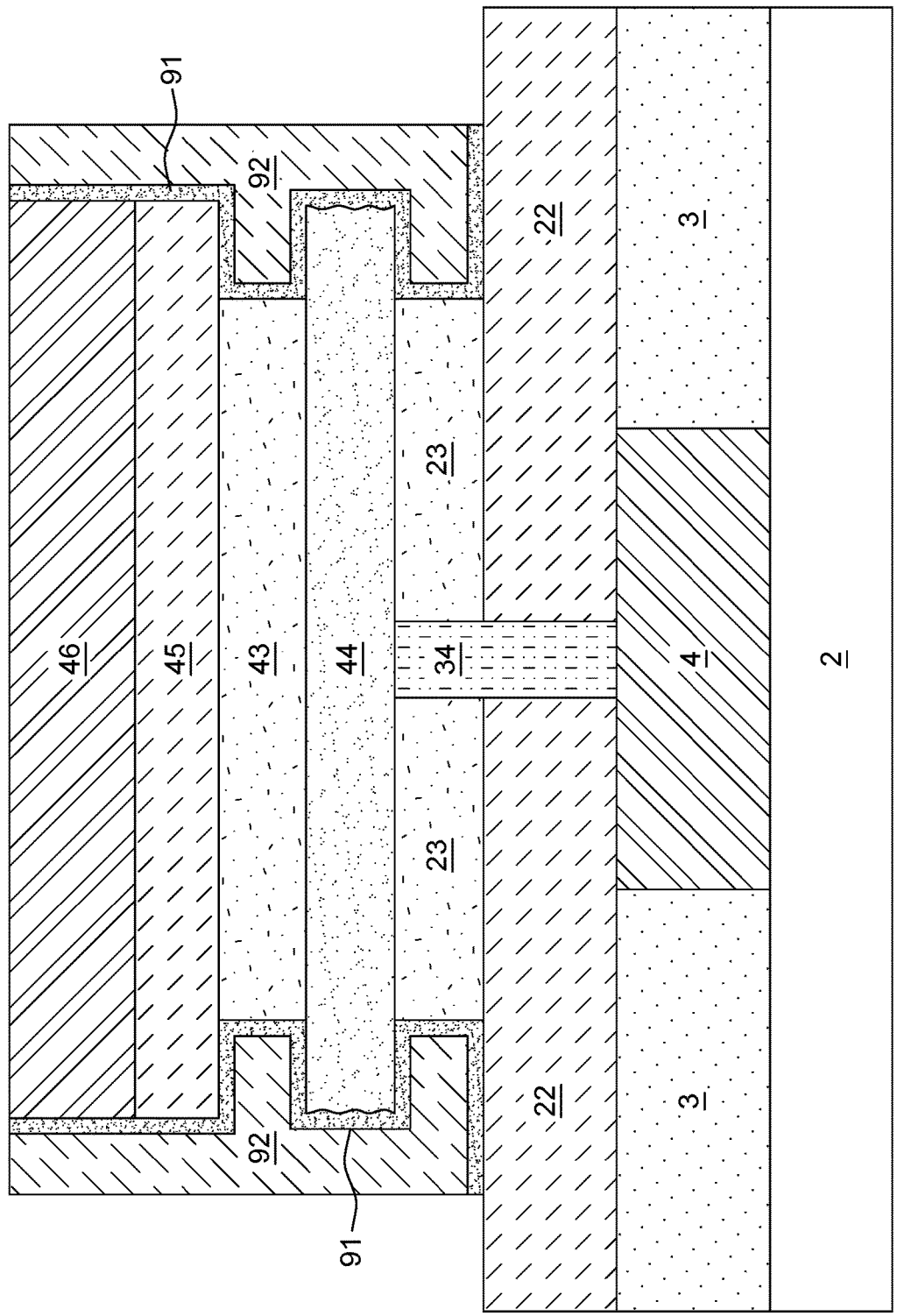
FIG. 10 depicts a cross-sectional view of the semiconductor structure after removing the exposed horizontal portions of the liner material and the conductive material in accordance with an embodiment of the present invention.

FIG. 10 depicts a cross-sectional view of device structure 1000 after removing the exposed horizontal portions of liner 91 and conductive material 92 in accordance with an embodiment of the present invention. As depicted, FIG. 10 includes the elements of FIG. 8 but with liner 91 and with conductive material 77 replaced by conductive material 92. In some examples, conductive material 92 is one of the materials used for conductive material 77. As previously discussed in detail with respect to FIG. 8, conductive material 92 like conductive material 77 surrounds the exposed portions of phase-change material 44. Conductive material 92 covers the sidewall and the exposed portions of the top and bottom surfaces of phase-change material 44 to increase the contact area between phase-change material 44 and conductive material 92.

Figure 11:
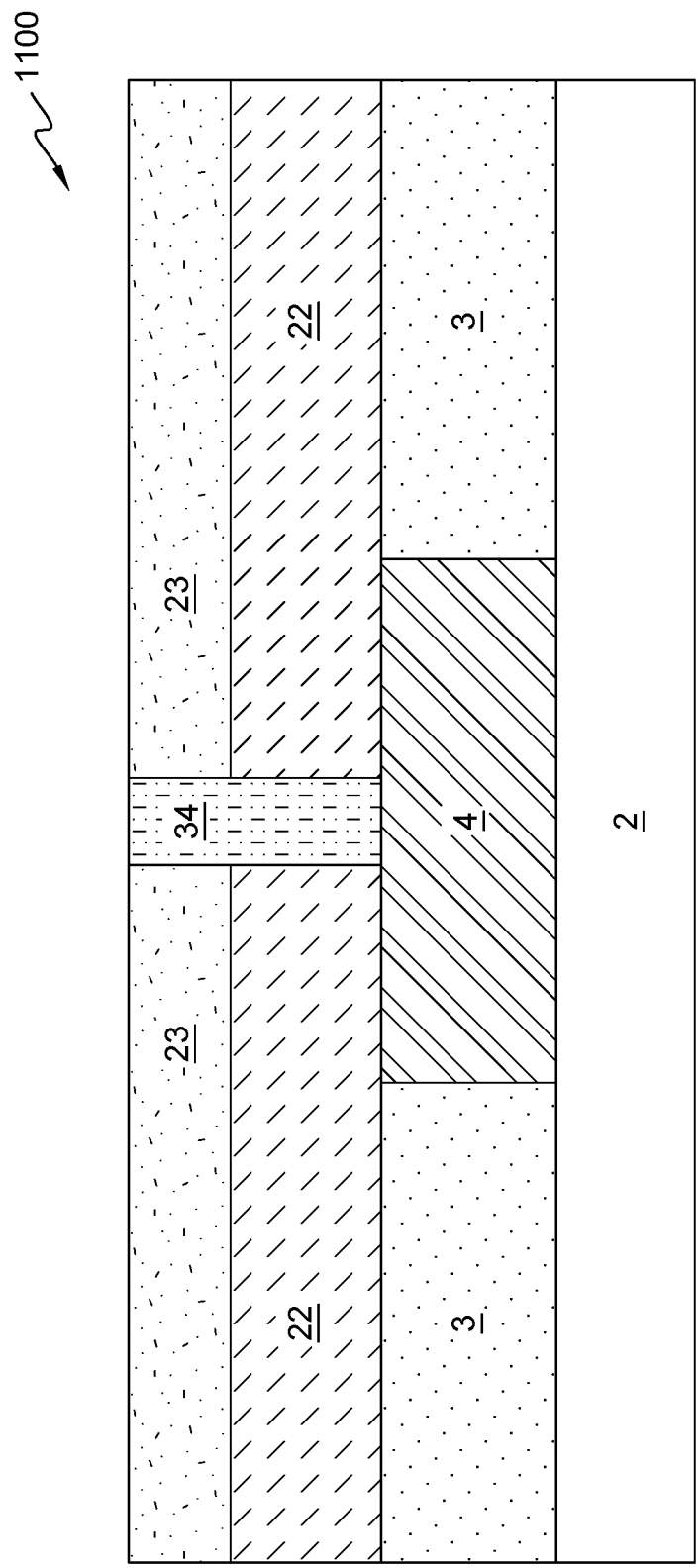
FIG. 11 depicts a cross-sectional view of a semiconductor structure after forming a heater on the bottom electrode in accordance with an embodiment of the present invention.

FIG. 11 depicts a cross-sectional view of device structure 1100 after forming heater 34 on bottom electrode 4 in accordance with an embodiment of the present invention. As depicted, FIG. 11 includes the elements of FIG. 3. Device structure 1100 and device structure 300 are essentially the same and can be formed with essentially the same materials and processes described with respect to device structure 300.

Figure 12:
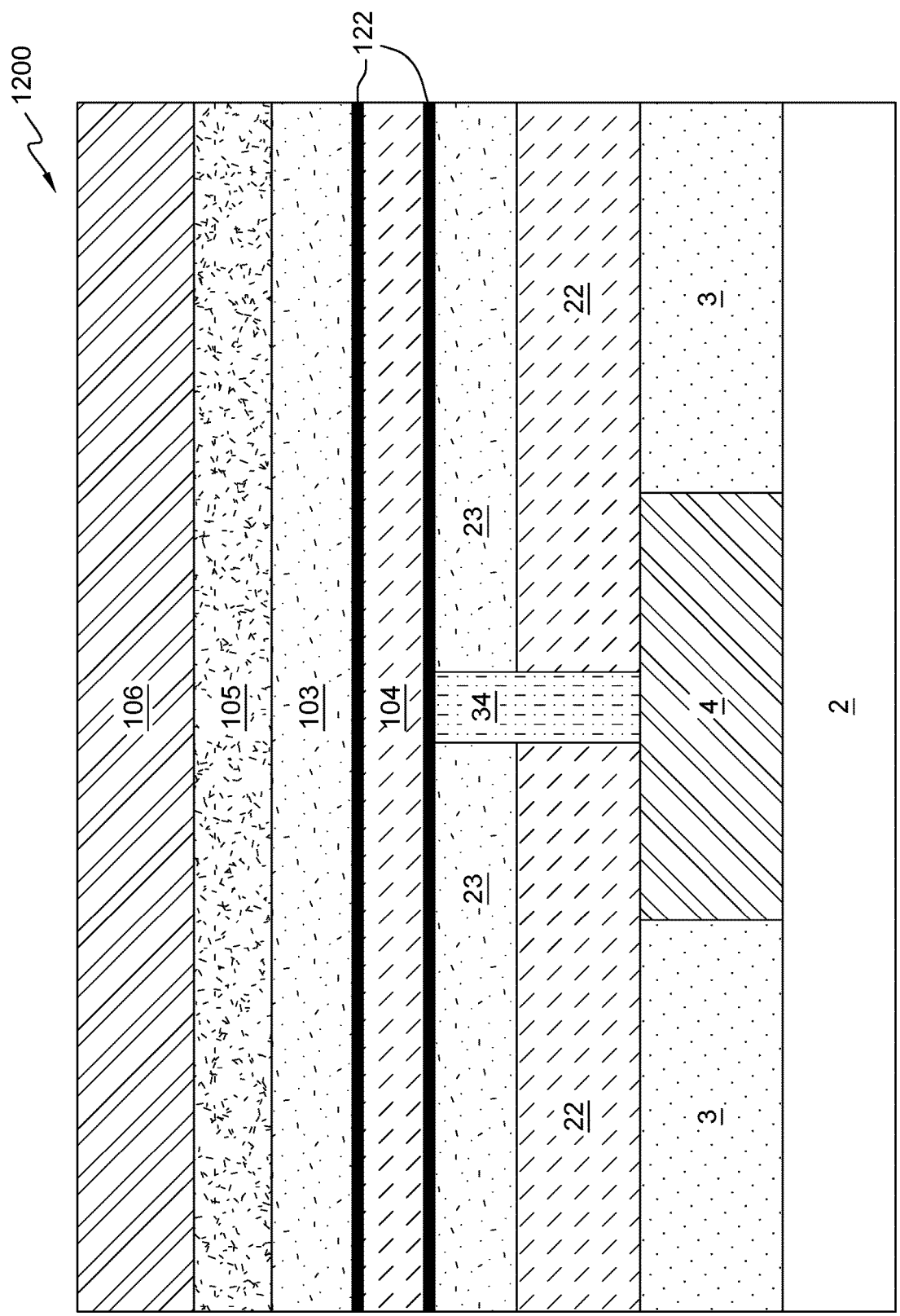
FIG. 12 depicts a cross-sectional view of the semiconductor structure after depositing a bottom layer of a resistive liner, layer of a phase change material on the bottom layer of the resistive liner, depositing a top layer of the resistive liner on the phase change material, depositing layers of two different dielectric materials forming a top bilayer dielectric on the top resistive liner, and a layer of a top electrode material on the top layer of the top bilayer dielectric on the semiconductor structure of FIG. 3 in accordance with an embodiment of the present invention.

FIG. 12 depicts a cross-sectional view of device structure 1200 after depositing a bottom layer of resistive liner 122, a layer of phase change material 104 on the bottom layer of resistive liner 122, depositing a second layer of resistive liner 122 on phase change material 104, depositing dielectric material 103 on the second layer of resistive liner 122, depositing dielectric material 105 on dielectric material 103, and depositing a layer of top electrode 106 on top of dielectric material 105 on device structure 300 depicted in FIG. 3 in accordance with an embodiment of the present invention. As depicted, FIG. 12 includes the elements of FIG. 11 and two layers of resistive liner 122 surrounding phase-change material 104, a second bilayer dielectric that is composed of dielectric material 103 and dielectric material 105, and top electrode 106. The materials of phase-change material 104, dielectric material 103, dielectric material 105, and top electrode 106 are essentially the same as phase-change material 44, dielectric material 43, dielectric material 45, and top electrode 46, respectively, and can be deposited by the same or similar known deposition processes (e.g., CVD, PVD, ALD, etc.) and can have the same or a similar thickness and types of materials. Similar to the criteria for selecting dielectric material 23 and dielectric material 22, dielectric material 103 and dielectric material 105 can be selected based on their etch selectivity. For example, an etchant for dielectric material 23 may not etch dielectric material 105.

Resistive liner 122 can be deposited using a conformal deposition process such as but not limited to ALD or CVD. For example, resistive liner 122 can be TaN or a hydrogenated carbon-based material but is not limited to these resistive liner materials. A typical thickness of resistive liner 122 can be 2 to 6 nm but is not limited to these thicknesses. Resistive liner 122 may be composed of any electrically conductive material that will not react with the phase-change material deposited in a later process step or during device operation. More specifically, the material for resistive liner 122 does not react with phase-change material 104 at the melting temperature of the phase change material 104 (e.g., above 650 deg. Celsius for GST).

Following a RESET pulse, an amorphous region of phase-change material 104 can form over to the heater 34. During read, the electrical current from heater 34 will flow through resistive liner 122 and bypass the amorphous region of phase-change material 104 since the material of resistive liner 122 is chosen such that it has a lower electrical resistance than the amorphous phase of phase-change material 104. The electrical current may transfer back to the crystalline phase change material 104 that remains unchanged by RESET at the edge of the amorphous region. This transfer takes place since the material for resistive liner 122 is chosen such that it has a higher resistance (at least ×10) than the crystalline phase of phase change material 104.

Figure 17:
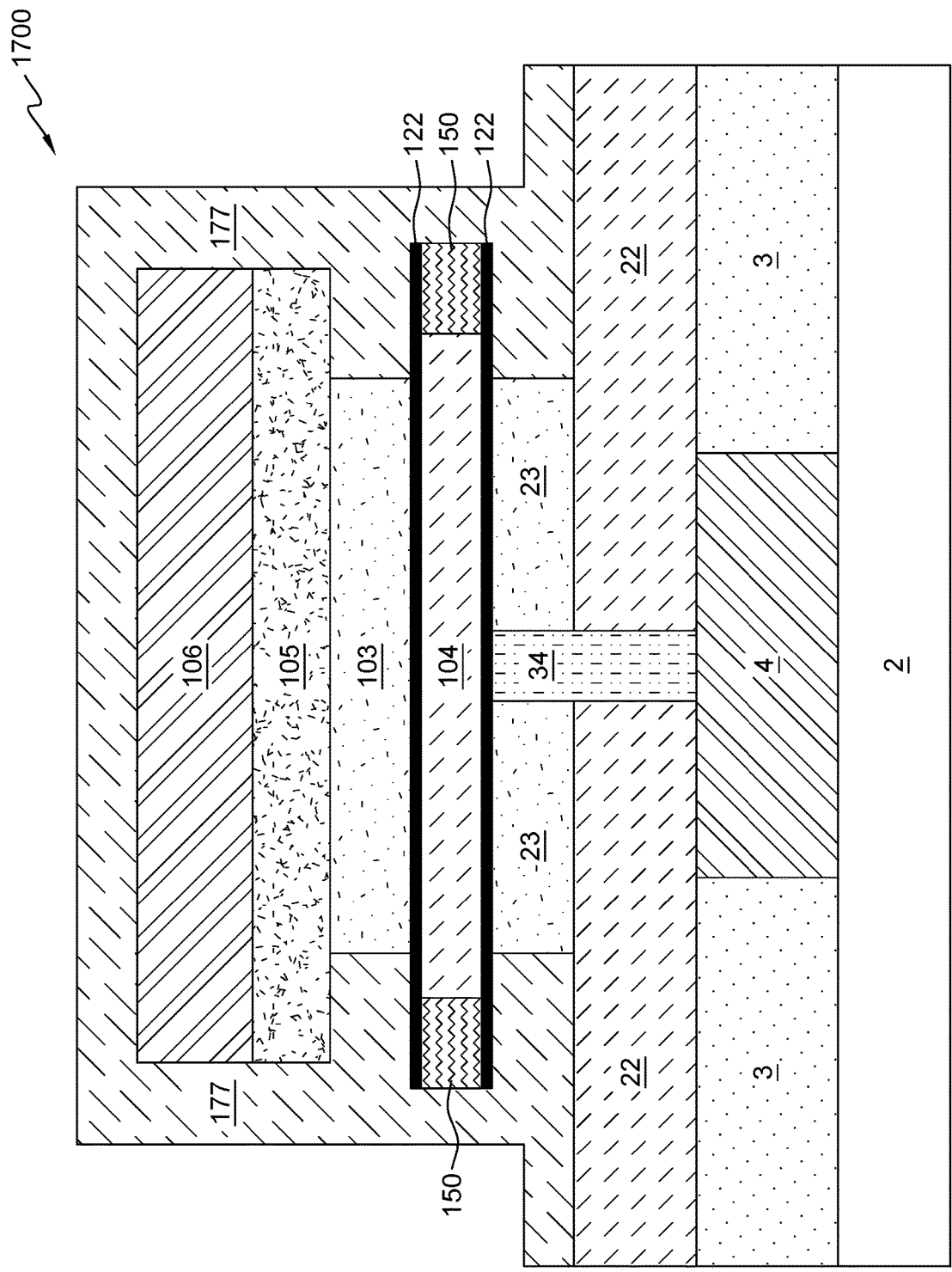
FIG. 17 depicts a cross-sectional view of the semiconductor structure after conformally depositing a layer of a conductive material in accordance with an embodiment of the present invention.

The electrical resistivity of phase-change material 104 in the crystalline state (e.g., following a SET pulse) is significantly lower than the electrical resistivity of resistive liner 122, and therefore, the electrical current, in this case, will travel from heater 34 through phase-change material 104 in the crystalline phase to top electrode 106 after the conductive cladding (i.e., conductive material 177 and contact 150) is deposited in later process steps as depicted in FIG. 17. The electrical resistance of resistive liner 122 may also be tuned by changing the composition of the resistive liner material. For example, when resistive liner 122 is composed of tantalum and nitrogen (TaN), increasing the amount of nitrogen in resistive liner material can increase the electrical resistivity of the resistive liner material.

Figure 13:
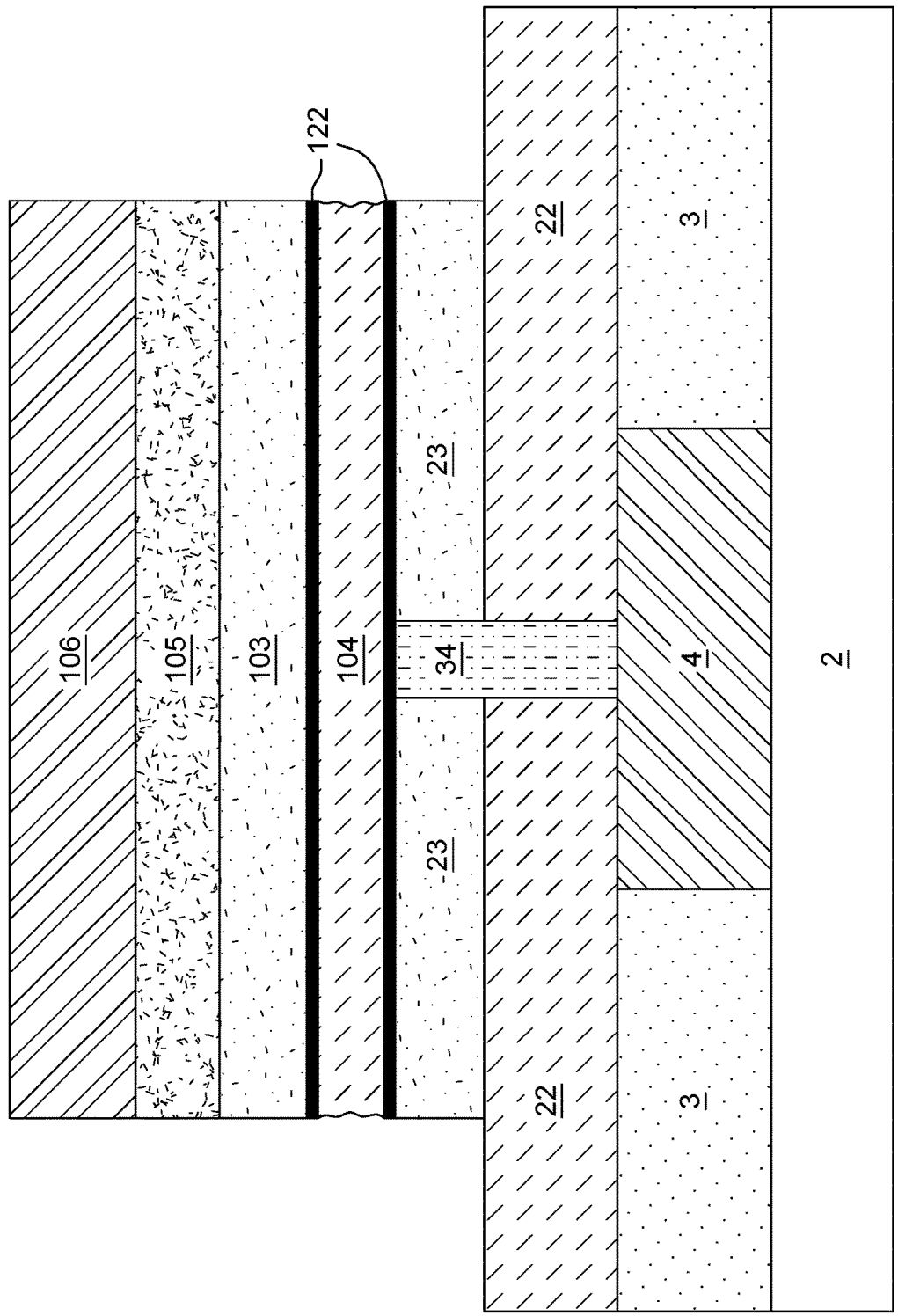
FIG. 13 depicts a cross-sectional view of the semiconductor structure after patterning the layer of the top electrode material and removing the exposed portions of the top electrode material, the top bilayer dielectric materials, the top layer of the resistive liner, the phase change material, the bottom layer of the resistive liner under the phase change material, and the top dielectric material in a bottom bilayer dielectric under the resistive material in accordance with an embodiment of the present invention.

FIG. 13 depicts a cross-sectional view of device structure 1300 after patterning top electrode 106 and removing the exposed portions of top electrode 106, dielectric material 105, dielectric material 103, portions of both layers of resistive liner 122, phase-change material 104, and dielectric material 23 in accordance with an embodiment of the present invention. As depicted, FIG. 13 includes the elements of FIG. 12 without portions of top electrode 106, dielectric material 105, dielectric material 103, resistive liner 122, phase-change material 104, and dielectric material 23.

After performing the directional etch, for example using ME, the remaining portions of the stacked materials in FIG. 13 form a pillar above dielectric material 22. The pillar can be composed of the remaining portions of top electrode 106, dielectric material 105 and 103, two layers of resistive liner 122 surrounding a layer of phase-change material 104, and dielectric material 23. In various embodiments, the pillar has a round or oval shape. In other embodiments, the pillar is a rectangular shaped pillar or column. However, in other examples, the pillar may be any shape or a combination of shapes (e.g., an irregular shape or a triangle combined with a circle, etc.). The bottom layer of the pillar is composed of dielectric material 23 which includes a top portion of heater 34. As previously discussed, after etching phase-change material 104 (e.g., by ME), the sidewall or outer exposed vertical edges of phase-change material 104 may be damaged by the ME process. The wavey vertical lines illustrate the damage that may occur to the sidewall of phase-change material 104 during the directional etching process as previously discussed in detail with reference to FIG. 5. In various embodiments, phase-change material 104 in the pillar has a disk or round shape after ME.

Figure 14:
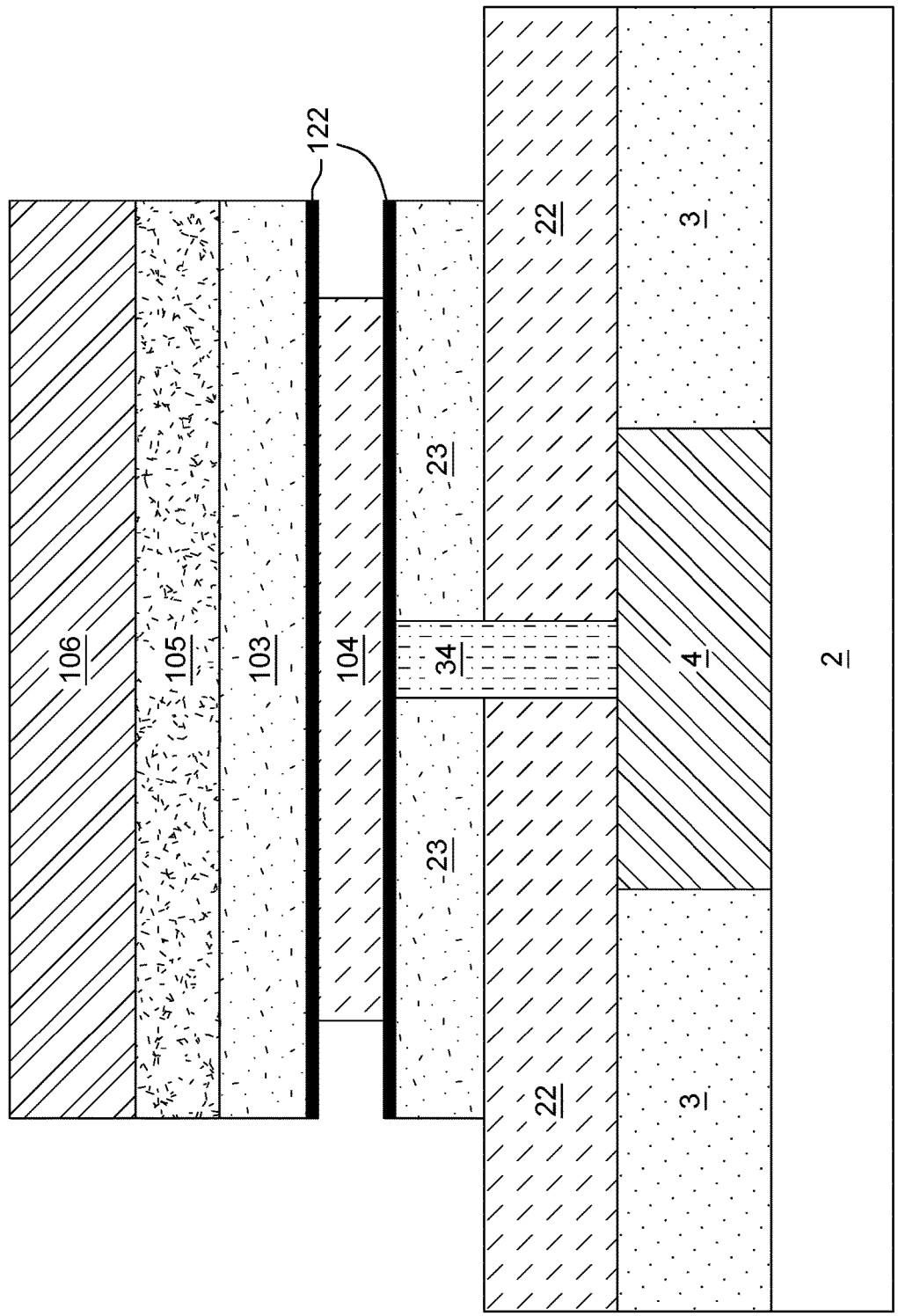
FIG. 14 depicts a cross-sectional view of the semiconductor structure after recessing the layer of the phase change material in accordance with an embodiment of the present invention.

FIG. 14 depicts a cross-sectional view of device structure 1400 after recessing phase change material 104 in accordance with an embodiment of the present invention. As depicted, FIG. 14 includes the elements of FIG. 13 with the exposed damaged sidewall of phase-change material 104 removed. An undercut of phase-change material 104 removes the damaged sidewall portion of phase-change material 104 and recesses the remaining portion of phase-change material 104 between the two layers of resistive liner 122. For example, using one or more of a dry etching process, a wet etching process, or a digital etching process where the digital etching process uses an oxidizer which is self-limiting, and then, uses an etchant that only removes the oxidized layer. Typically, the oxidizer will be $H_2O_2$, and the etchant will be diluted HF. This process is repeated multiple times until the desired amount of phase-change material 104 is removed and an undamaged surface of the sidewall of phase-change material 104 is exposed. The recessing of phase-change material 104 also exposes a portion of the bottom surface of the top resistive liner 122 and a portion of the top surface of the bottom resistive liner 122.

In another example, phase-change material 104 can be recessed with minimal etching of the surrounding dielectric material 23 and dielectric material 43, using a Cl$_2$-based chemistry in a dry etching process. The process can have a high selectivity for etching phase-change material 104 with respect to dielectric material 23 and dielectric material 43 can be obtained.

The damaged sidewall and the portions of phase-change material 104 directly adjacent to the sidewall can also be removed, for example, using the selective dry etching process such as a zero-biased RIE (which provides isotropic etching) or a wet etching process. The undercut or horizontal length of phase-change material 104 removed can vary and may range from 5 nm to 50 nm but is not limited to these distances.

Figure 15:
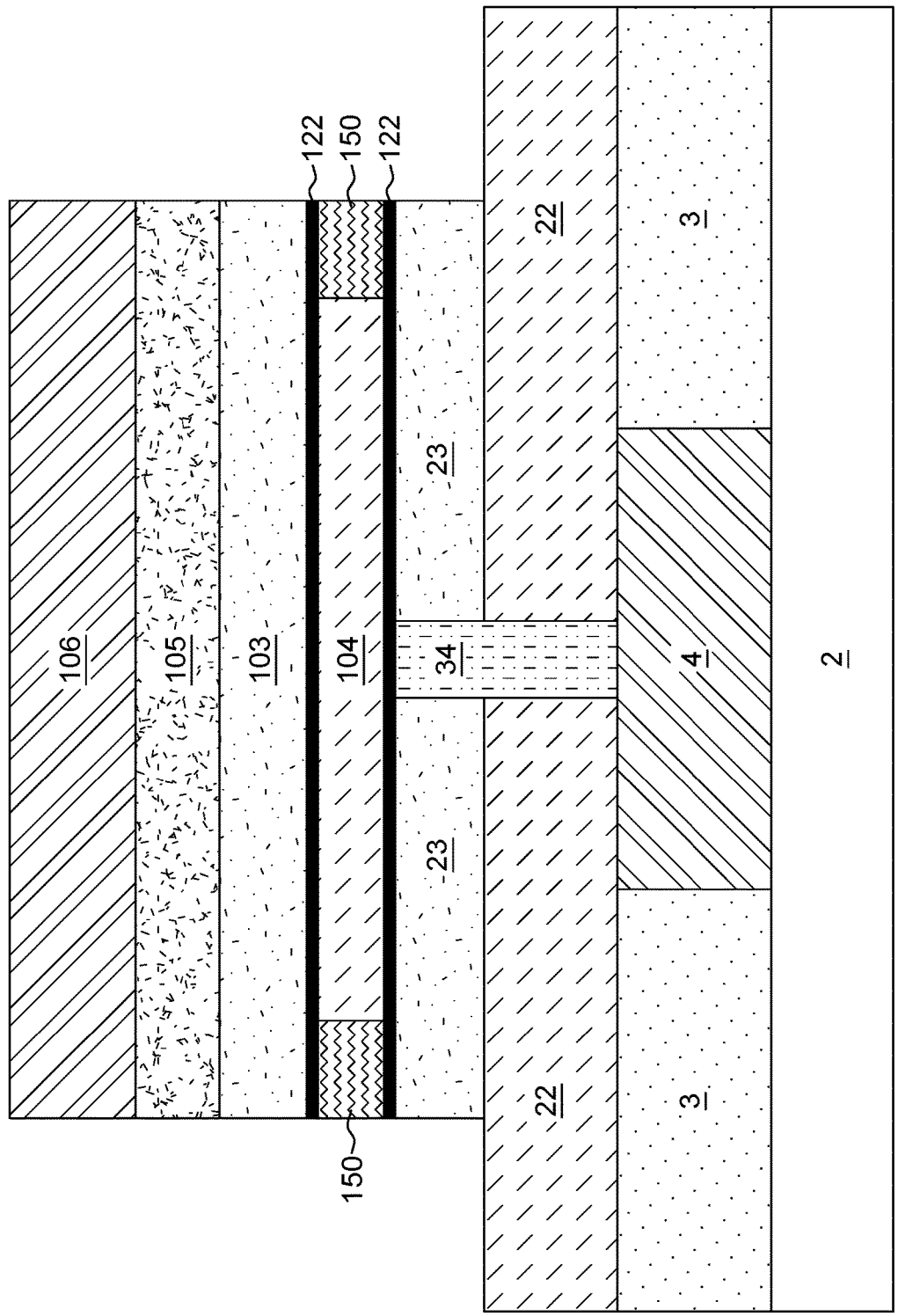
FIG. 15 depicts a cross-sectional view of the semiconductor structure after conformally depositing a layer of a conductive material over and around the semiconductor structure and performing an anisotropic etch to remove the exposed horizontal portions of the conductive material in accordance with an embodiment of the present invention.

FIG. 15 depicts a cross-sectional view of device structure 1500 after conformally depositing a conductive material over and around the device structure to form lateral contact 150 and removing the exposed horizontal portions of conductive material to form lateral contact 150 in accordance with an embodiment of the present invention. As depicted, FIG. 15 includes the elements of FIG. 14 with lateral contact 150 formed between the two layers of resistive liner 122. Lateral contact 150 directly abuts the undamaged sidewall of phase-change material 104.

A layer of a conductive material for lateral contact 150 is conformally deposited, for example, by ALD or another suitable conformal deposition process that can pinch off or fill the recessed area between the two layers of resistive liner 122. Lateral contact 150 can be composed of TiN, for example, but is not limited to this conductive material. After the conformal deposition, the exposed horizontal portions of lateral contact 150 that are not between the two layers of resistive liner 122 are removed (e.g., by RIE). After deposition and etching of lateral contact 150, a portion of the conductive material for lateral contact 150 directly abuts and surrounds the undamaged sidewall of phase-change material 104. In this way, the electrical contact resistance between lateral contact 150 and the undamaged sidewall of phase-change material 104 is lower than the electrical contact resistance of the same conductive material with the same contact area and the damaged sidewall of phase-change material 104 after RIE to form the pillar discussed with respect to FIG. 13.

Figure 16:
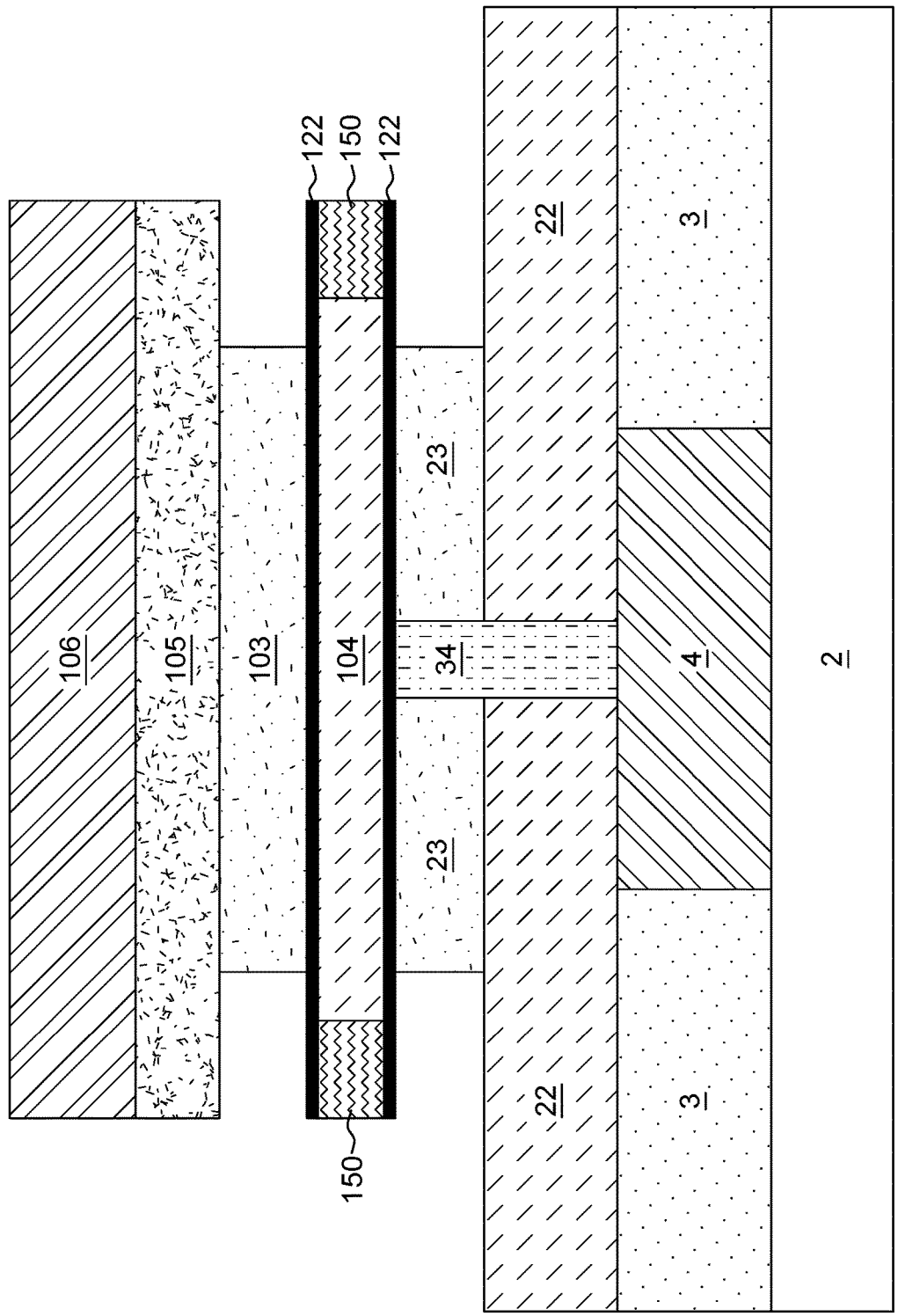
FIG. 16 depicts a cross-sectional view of the semiconductor structure after recessing the layer of dielectric material over the top resistive liner and under the bottom resistive liner on the heater element, the portions of the first dielectric material, and the conductive liner in accordance with an embodiment of the present invention.

FIG. 16 depicts a cross-sectional view of device structure 1600 after recessing a portion of dielectric material 103 over the top layer of resistive liner 122 on phase-change material 104 and recessing dielectric material 23 under the bottom layer of resistive liner 122 in accordance with an embodiment of the present invention. As depicted, FIG. 16 includes the element of FIG. 15 with external, exposed sidewall portions of dielectric material 23 and dielectric material 103 removed. The etch back of dielectric material 23 and dielectric material 103 exposes a portion of the top surface of the upper layer of resistive liner 122 and a portion of the bottom surface of the bottom layer of resistive liner 122. In various embodiments, the etch back dielectric material 23 and dielectric material 103 is done in the same process step. In one embodiment, more than one etching process is used to recess dielectric material 23 and dielectric material 103. The etch back or recessing of dielectric material 23 and dielectric material 103 essentially removes the same or similar amount of each of dielectric material 23 and dielectric material 103. In various embodiments, dielectric material 23 and dielectric material 103 are composed of the same material, although, in some embodiments, dielectric material 43 and dielectric material 103 are different dielectric materials. In some examples, dielectric material 23 and dielectric material 103 are composed of a nitride or oxide material such as SiN or SiO$_2$ but are not limited to these dielectric materials.

The etch back of dielectric material 23 and dielectric material 103 can occur using one of the etchants and processes (e.g., a hot phosphoric acid) previously discussed in detail with respect to FIG. 6 or another etching process/etchant selective to dielectric material 23 and dielectric material 103 but not to dielectric material 22 or dielectric material 105. After recessing dielectric material 23 and dielectric material 103, the sidewalls of the remaining portions of dielectric material 23 and dielectric material 103 are under a portion of phase-change material 104 (e.g., the horizontal lengths of the remaining portions of dielectric material 23 and dielectric material 103 is less than the horizontal length of phase-change material 104. As depicted in FIG. 16, each of the two layers of resistive liner 122 have a horizontal length that is longer than the horizontal length of phase-change material 104, and dielectric material 23 and dielectric material 104 have a horizontal length that is less than the horizontal length of phase-change material 104. As depicted in FIG. 16, the sidewall of lateral contact 150 is even with the outside edges or sidewalls of the two layers of resistive liner 122 (e.g., the edges of the two resistive liners 122 and lateral contact 150 form an essentially vertical face with their sidewalls).

In FIG. 16, lateral contact 150 resides between the outer portions of the two layers of resistive liner 122 that extend beyond phase-change material 104. Lateral contact 150 abuts phase-change material 104 while the remaining portions of dielectric material 23 and dielectric material 103 are centered directly under and over the bottom resistive liner 122 and the top resistive liner 122, respectively and are centered in phase-change material 104 that is between the two resistive liners 122. For example, dielectric material 23 and dielectric material 103 may be recessed approximately 5 to 100 nm less than the horizontal length of phase-change material 104 but is not limited to these different lengths.

FIG. 17 depicts a cross-sectional view of device structure 1700 after conformally depositing conductive material 177 in accordance with an embodiment of the present invention. As depicted, FIG. 17 includes the elements of FIG. 16 with conductive material 177 added over device structure 1700. Conductive material 177 is conformally deposited (e.g., ALD or CVD) and fills the recesses created by the etch back of dielectric material 23 and dielectric material 103. As depicted in FIG. 17, conductive material 177 is over and/or around the exposed surfaces of dielectric material 22, dielectric material 23, portions of the bottom and the top exposed surfaces of both layers of resistive liner 122, lateral contact 150, dielectric material 103, dielectric material 105, and top electrode 106.

Conductive material 177 can be composed of any suitable electrically conductive material such as a metal or metal alloy. For example, conductive material 177 can be TiN but is not limited to this conductive material. In various embodiments, conductive material 177 and lateral contact 150 are composed of the same electrically conductive material. In some embodiments, conductive material 177 is composed of a different electrically conductive material than lateral contact 150.

Figure 18:
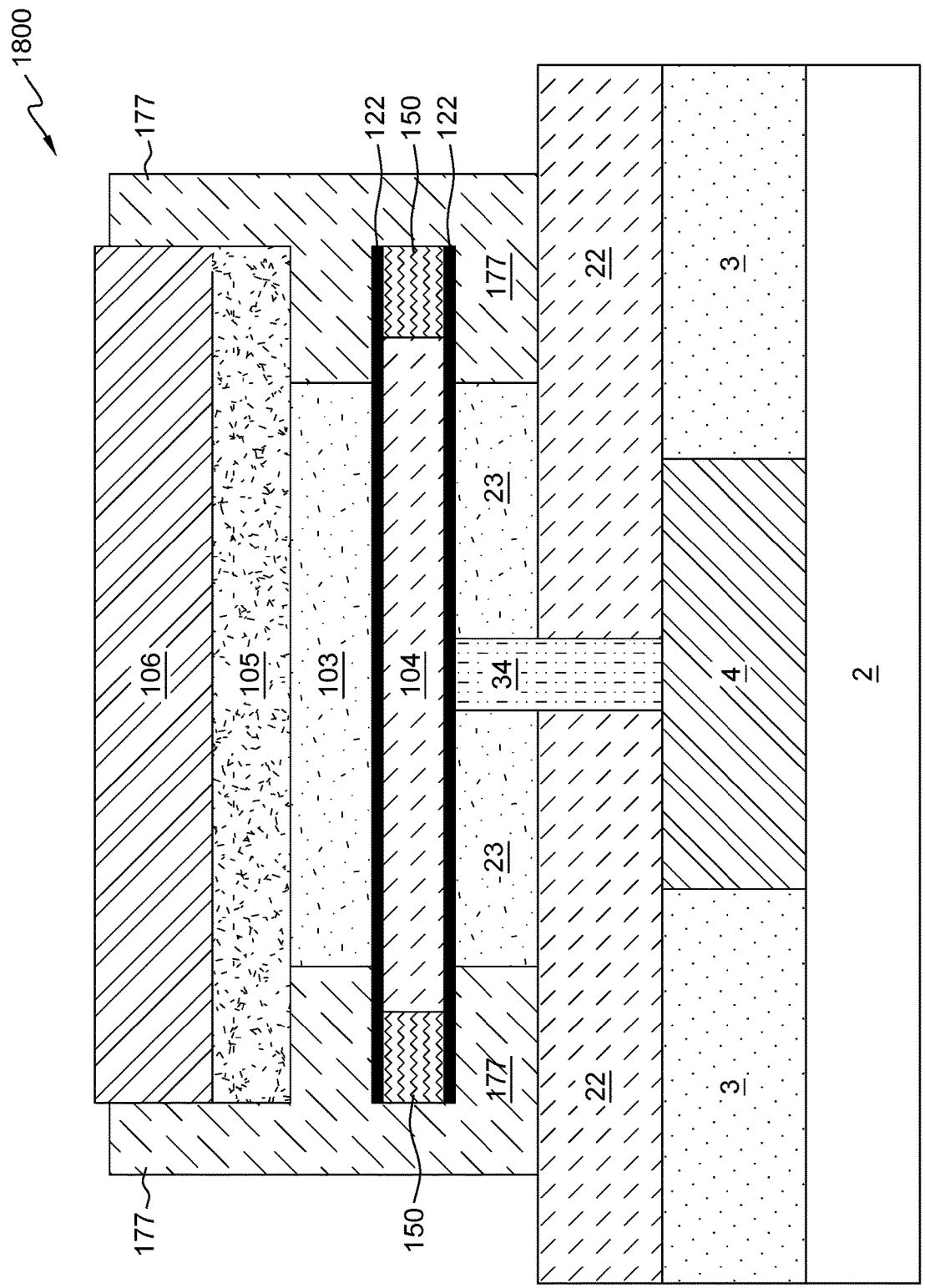
FIG. 18 depicts a cross-sectional view of the semiconductor structure after etching the exposed horizontal portions of the conductive material in accordance with an embodiment of the present invention.

FIG. 18 depicts a cross-sectional view of device structure 1800 after etching the exposed horizontal portions of conductive material 177 in accordance with an embodiment of the present invention. As depicted, FIG. 18 includes substrate 2, bottom electrode 4, dielectric layer 3, the remaining portions of conductive material 177 along the sidewall or vertical sides of dielectric material 23, lateral contact 150, recessed dielectric material 103, the sides and a portion of the bottom surface of dielectric material 105, a portion of the sidewall top electrode 106, the outer edge and portions of the bottom surface of the bottom layer of resistive liner 122 along with the edge and a portion of the outer edge and top surface of the top resistive liner 122. After the directional etching process (e.g., RIE), conductive material 177 remains along at least a bottom portion of top electrode 106 and may, in some cases, contact most of the sidewall of top electrode 106. A portion of conductive material 177 resides directly on a portion of dielectric material 22 in the bottom bilayer dielectric composed of dielectric material 22 and the recessed dielectric material 23. Conductive material 177 can carry electrical current or signals from lateral contact 150 to top electrode 106. Lateral contact 150 may receive the electrical current or signals from heater 34 from one or both of phase-change material 104 or resistive liner 122 (e.g., dependent on the material phase or state of phase-change material 104 as previously discussed).

As depicted in FIG. 18, device structure 1800 provides direct contact between conductive material 177 and a portion of each layer of resistive liner 122 (i.e., direct contact to a portion of the top and bottom surfaces of each of the top and bottom layer of resistive liner 122, respectively and the ends or sidewall of each layer of resistive liner 122). Device structure 1800 also provides direct contact of phase-change material 104 with lateral contact 150 where the sidewalls of lateral contact 150 directly abut or contact conductive material 177 and phase-change material 104 residing between the two layers of resistive liner 122.

In various embodiments, device structure 1800 provides an electrical path that goes from bottom electrode 4 through heater 34 to bottom resistive liner 122 through either one or both of phase-change material 104 and resistive liner 122 (e.g., depending on phase-change material 104 phase). For example, when phase-change material 104 is in a crystalline phase which is the phase or atomic structure of phase-change material 104 with a lower electrical resistance than resistive liner 122, device structure 1800 can provide an electrical path from heater 34 through the bottom layer of resistive liner 122 through phase-change material 104 and, then passing through the undamaged sidewall of phase-change material 104 to lateral contact 150 abutting contact material 177 connecting to top electrode 106. As previously discussed, lateral contact 150 can be composed of the same conductive material as conductive material 177. Some of the electrical current will transfer from the phase change material 104 through the resistive liner 122 to conductive material 177. The electrical current distribution will depend, at least in part, on the extent of the recess of dielectric materials 23 and 103.

In many cases, when a portion of phase-change material 104 is in the amorphous state, a portion of the electrical current may travel through resistive liner 122 adjacent to the amorphous portion of phase-change material 104 and a portion of the electrical current may pass through the portion of phase-change material 104 that is not in the amorphous state (e.g., a portion of phase-change material 104 in a crystalline state or low resistance state. More specifically, following a RESET pulse, an amorphous region of phase-change material 104 can form over the heater 34. During read, the electrical current from heater 34 will flow through resistive liner 122 and bypass the amorphous region of phase-change material 104 since the material of resistive liner 122 is chosen such that it has a lower electrical resistance than the amorphous phase of phase-change material 104. The electrical current may transfer back to the crystalline phase change material 104 that remains unchanged by RESET at the edge of the amorphous region. This transfer takes place since the material for resistive liner 122 is chosen such that it has a higher resistance (at least ten times higher) than the crystalline phase of phase change material 104.

As depicted in device structure 1800, the phase-change memory device includes top electrode 106, a top bilayer dielectric composed of dielectric material 105 and the recessed dielectric material 103, lateral contact 150, phase-change material 104 abutting lateral contact 150, and between the top and bottom layers of resistive liner 122, the bottom bilayer dielectric composed of the recessed dielectric material 23 and dielectric material 22, heater 34 in the bottom bilayer dielectric contacting the bottom resistive liner 122 and residing on bottom electrode 4 above substrate 2. In various embodiments, the top bilayer dielectric and the bottom bilayer dielectric are composed of the same dielectric materials that are deposited in the reverse order. For example, dielectric material 22 and dielectric material 105 may be low-k dielectric materials, and dielectric material 23 and dielectric material 105 can be an oxide-based material or a nitride-based dielectric material. As previously discussed, in some cases, one or both materials in the top bilayer dielectric and the bottom dielectric can be different dielectric materials.

As depicted in device structure 1800, some of the layers of materials have a different length or width within device structure 1800. For example, the length of the layer or the width of the layer of dielectric material 23 and dielectric material 103 in device structure 1800 is less than the length or width of the layer of phase-change material 104. Similarly, the width of each of resistive liner 122 around phase-change material 104 is greater than the width or length of phase-change material 104. With the recess of phase-change material 104, for example, using a digital etching process, a dry or a wet etching process as previously described, provides an undamaged surface on the sidewall of phase-change material 104 contacting the conductive material of lateral contact 150. Additionally, recessing dielectric material 23 and dielectric material 103 exposes a portion of the top surface and the bottom surface of each to the two layers of resistive liner 122 for contact with lateral contact 150 and conductive material 177 forming a conductive cladding contacting to top electrode 106. Conductive material 177 contacts a portion of the two layers of resistive liner 122. As depicted, conductive material 177 contacts a portion of the two resistive liners over an outer portion of phase-change material 104 and contacts the portions of the two layers of resistive liner 122 extending beyond the sidewall of phase-change material 104.

As known to one skilled in the art, the thickness and lengths of the various layers of the materials depicted in FIG. 18 represent only one example of embodiments of the present invention and in other examples, the thickness and/or lengths of the material layers can be different. For example, as depicted in FIG. 18, phase-change material 104 is a thin layer of phase-change material 104 but in other examples, phase-change material 104 can have any thickness (i.e., phase-change material 104 can be a thick layer of phase-change material 104).

Figure 19:
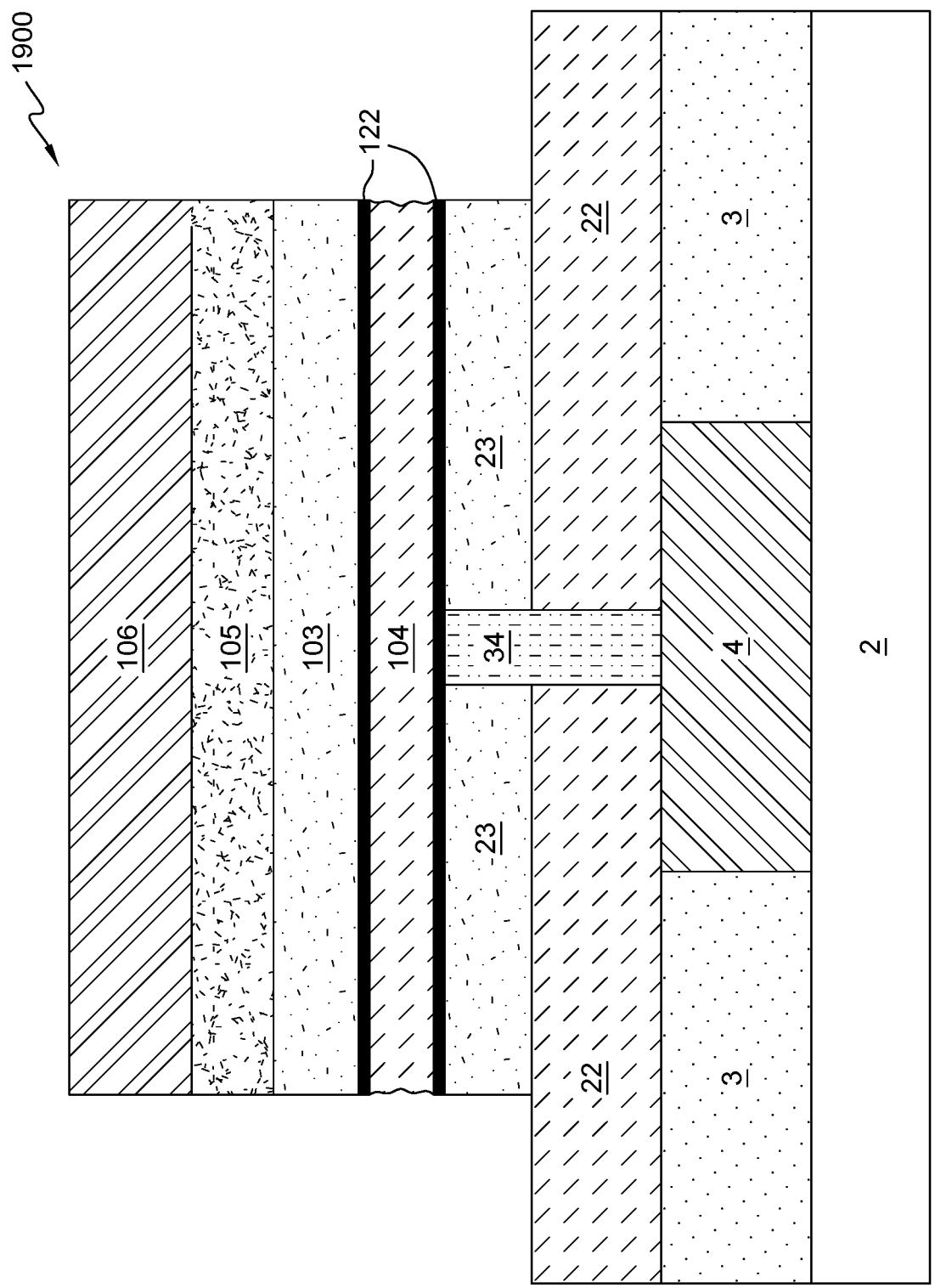
FIG. 19 depicts a cross-sectional view of the semiconductor structure after forming a pillar composed of a portion of the top electrode material, the two layers of the two different dielectric materials, the second resistive liner, the phase change material, the first resistive liner, and a portion of the top layer of the dielectric material surrounding the heater in accordance with an embodiment of the present invention.

FIG. 19 depicts a cross-sectional view of device structure 1900 after forming a pillar composed of top electrode 106, dielectric material 105, dielectric material 103, the two layers of resistive liner 122 surrounding phase change material 104, dielectric material 23, and a top portion of heater 34 in dielectric material 23 in accordance with an embodiment of the present invention. As depicted, FIG. 19 includes the elements of FIG. 13. Device structure 1900 can be formed with essentially the same or similar processes and materials as are used to form device structure 1300. After using an RIE, for example, to form the pillar depicted in FIG. 19, the sidewall of phase-change material 104 is damaged. For example, after etching, the sidewall of phase-change material 104 may have a different composition or a rough surface. The rough surface or slightly different composition of the etched sidewall of phase-change material 104 can increase the electrical contact resistance between phase-change material 104 and any electrically conductive material deposited in later process steps. The electrical contact resistance of the as-deposited or undamaged phase-change material 104 is lower than the electric contact resistance of the damaged sidewall of phase-change material 104 after the directional etching (e.g., by ME).

Figure 20:
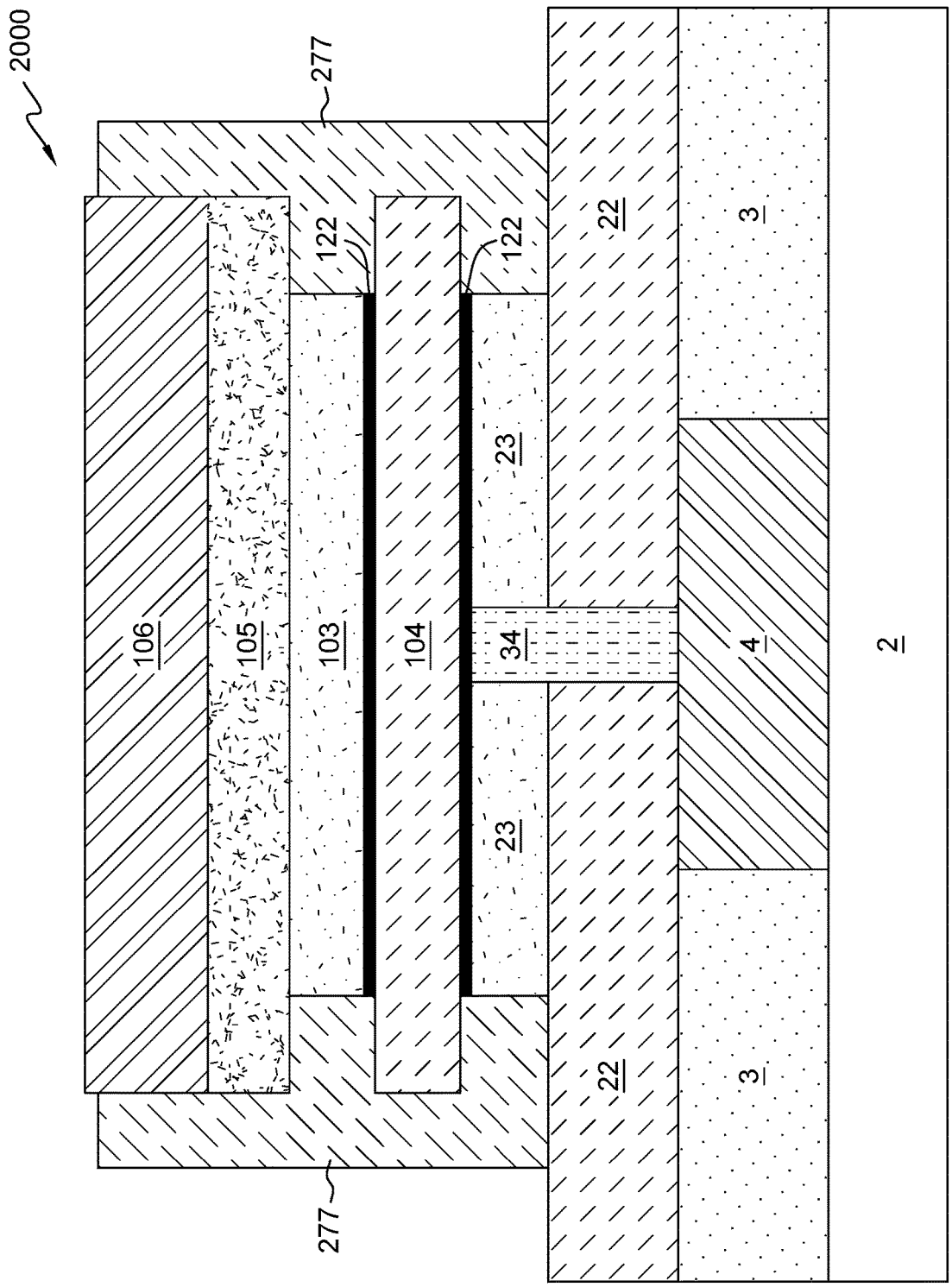
FIG. 20 depicts a cross-sectional view of the semiconductor structure after recessing the two resistive liners surrounding the phase change material and recessing the dielectric material directly over and under the two resistive liners, conformally depositing a layer of a conductive material, and removing the exposed horizontal portions of the conductive material in accordance with an embodiment of the present invention.

FIG. 20 depicts a cross-sectional view of device structure 2000 after recessing dielectric material 103 and dielectric material 23 directly over and under the two resistive liner 122, respectively, recessing a portion of the two layers of resistive liner 122, conformally depositing conductive material 277, and removing the exposed horizontal portions of conductive material 277 in accordance with an embodiment of the present invention. As depicted, FIG. 20 includes substrate 2, bottom electrode 4, dielectric layer 3, the remaining portions of conductive material 277 along vertical sides of the recessed dielectric material 23, the recessed dielectric material 103, dielectric material 105 a portion of the sidewall of top electrode 106, the sidewall or edge of each of the two resistive liners 122, the sidewall of phase-change material 104 and a portion of the top surface and the bottom surface of phase-change material 104. In addition, a portion of conductive material 277 resides directly on a portion of dielectric material 22. Semiconductor structure 2000 is similar to semiconductor structure 800 and may be formed with some of the same processes but semiconductor structure 200 has two layers of resistive liner 122 surrounding phase-change material 104. As depicted, after recessing resistive liner 122, the two layers of resistive liner 122 around phase-change material 104 can have the same length as dielectric materials 23 and 103. As depicted, a portion of conductive material 277 directly contacts the vertical side or sidewall of phase-change material 104, a portion of the top surface of phases-change material 104, and a portion of the bottom surface of phase-change material 104. Conductive material 277 can directly contact the portions of phase-change material 104 that extend beyond the layers of resistive liner 122 surrounding phase-change material 104.

Recessing or etching back dielectric material 23 and dielectric material 103 may occur using one of the previously discussed dielectric material etching processes discussed with respect to FIG. 8 (e.g., a hydrofluoric acid etchant, an $H_3PO_4$ etchant, a heated phosphoric acid, etc.). As previously discussed with respect to FIG. 8, some erosion or slight composition change may occur to the exposed surfaces of phase-change material 104 during the etching of the material of dielectric material 23 and dielectric material 103. After recessing the two dielectric materials, the exposed portions of each of the two layers of resistive liner 122 surrounding the outer portion of phase-change material 104 can be removed. For example, using a mixture of $H_2O_2$ and ethylenediaminetetraacetic (EDTA), resistive liner 122 may be etched back when resistive liner 122 is composed of TaN. The etch back of the two layers of resistive liner 122 exposes the outer portion of phase-change material 104 (e.g., the portion of phase-change material 104 not covered by either of resistive liner 122).

After etching back dielectric material 23, dielectric material 103, and etching back resistive liner 122, a portion of phase-change material 104 extends beyond the remaining portions of resistive liner 122 and dielectric material 23 and the recessed dielectric material 105. In some cases, as previously discussed, the surface of the extension of phase-change material 104 may be rough, rounded, or have a slightly different composition after etching back resistive liner 122. In other cases, the surface of phase-change material 104 is essentially the same or basically unaffected by the etch back process. As depicted, the vertical sides of dielectric material 23 and dielectric material 103 are basically above and below each other and are generally over and under the remaining portions of resistive liner 122.

After performing the etch back of dielectric material 23 and dielectric material 103 followed by the etch back of the two layers of resistive liner 122, conductive material 277 is conformally deposited on the exposed surfaces of dielectric material 22, phase-change material 104, top electrode 106 and around the exposed sides of the recessed dielectric material 23, each of resistive liner 122, and the top bilayer dielectric composed of dielectric material 103 and dielectric material 105.

Using a directional etching process (e.g., RIE), the horizontal portions of conductive material 277 can be removed. The remaining portion of conductive material 277 on a portion of dielectric material 22 covers a portion of the top surface, the bottom surface, and the sidewall of phase-change material 104 along with the sidewalls of the materials in the pillar formed after the directional etching process (i.e., composed of dielectric material 23, both of resistive liner 122, phase-change material 104, dielectric material 103, dielectric material 105, and top electrode 106). As depicted, conductive material 277 connects phase-change material 104 to top electrode 106.

As previously discussed, the two layers of resistive liner 122 surround phase-change material 104 in the center area or switching region of phase-change material 104 to mitigate the effects of resistance drift that can occur in the amorphous state of phase-change material 104. Additionally, device structure 2000 increases the contact area between phase-change material 104 and conductive material 277 thereby, reducing the electrical resistance of the interface between phase-change material 104 and conductive material 277 compared to conventional PCM device structures and in particular, compared to PCM device structures formed using a thin layer of the phase-change material 104. Device structure 2000 provides direct contact on the sidewall, a portion of the top surface and the bottom surface of phase-change material 104 with conductive material 277. The extension of phase-change material 104 beyond dielectric material 23 and dielectric material 103 provides a larger surface area contacting conductive material 277 which improves the PCM device electrical performance as previously discussed. The length of the extension and the amount of contact area between conductive material 277 and phase-change material 104 can be customized by the length, type of etch back processes, and device performance requirements. As compared to conventional PCM devices with thin layers of the phase-change material, semiconductor structure 2000 can provide a much larger contact area of phase-change material 104 with conductive material 277.

Figure 21:
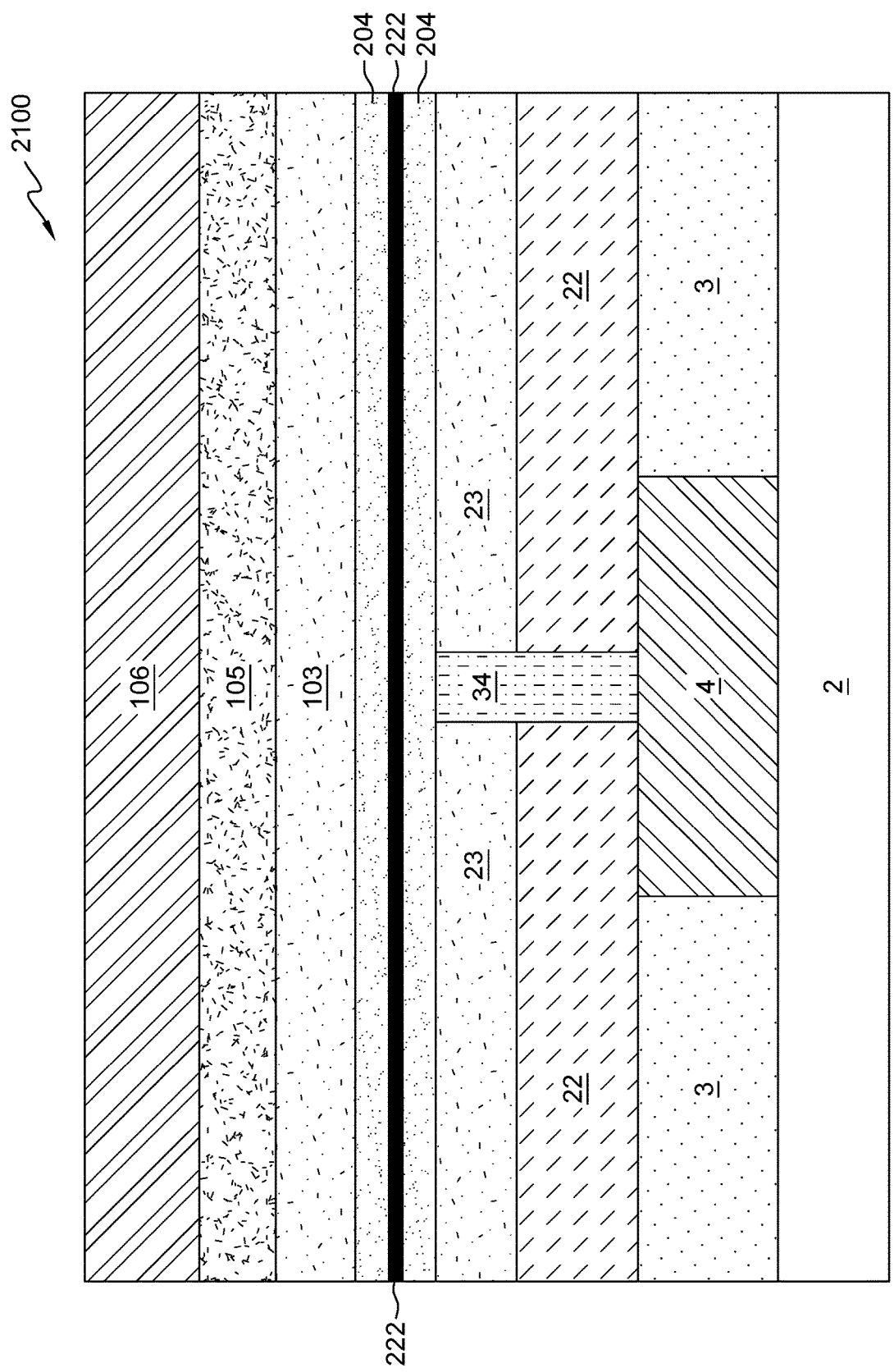
FIG. 21 depicts a cross-sectional view of the semiconductor structure after depositing a first layer of the phase change material on the semiconductor structure of FIG. 3, depositing a layer of the resistive liner material over the first layer of the phase change material, depositing a second layer of the phase change material over the layer of the resistive liner, depositing two layers of different dielectric materials forming the top bilayer dielectric, and depositing a top electrode material over the top bilayer dielectric in accordance with an embodiment of the present invention.

FIG. 21 depicts a cross-sectional view of device structure 2100 after depositing a bottom layer of phase change material 204 on the semiconductor structure of FIG. 3, depositing a layer of resistive liner 222 over the bottom layer of phase change material 204, depositing a top layer of phase change material 204 over resistive liner 222, depositing dielectric material 103, dielectric material 105, and top electrode 106 in accordance with an embodiment of the present invention. As depicted, FIG. 21 includes the elements of FIG. 12 but with phase-change material 104 and the two layers of resistive liner 122 replaced with a single layer of resistive liner 222 that is between two layers of phase-change material 204. The materials of resistive liner 222 and phase-change material 204 can be any of the materials previously discussed for phase-change material 104 and resistive liner 122.

Resistive liner 222 residing between phase-change material 204 layers can reduce the effects of resistance drift in the top layer of phase-change material 204. In some cases, the two layers of phase-change material 204 have the same thickness but in other cases, the thickness of the two layers can be different (e.g., the top layer of phase-change material 204 is slightly thinner than the bottom layer of phase-change material 204).

Figure 22:
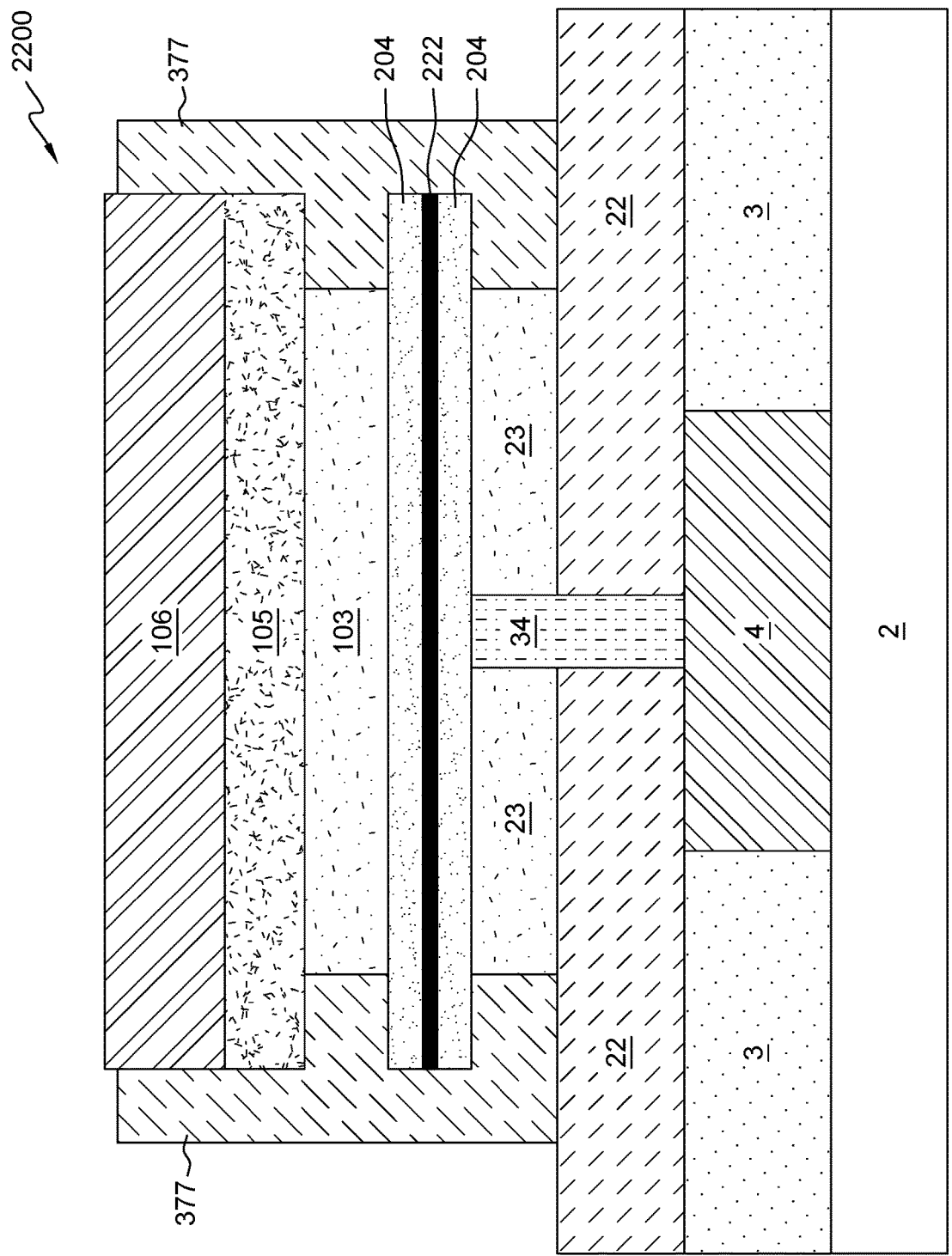
FIG. 22 depicts a cross-sectional view of the semiconductor structure after recessing the layer of dielectric material over the second layer of the phase change material and under the first layer of the phase change material, conformally depositing a layer of the conductive material, and removing the exposed horizontal portions of the conductive material in accordance with an embodiment of the present invention.

FIG. 22 depicts a cross-sectional view of device structure 2200 after recessing dielectric material 23 and dielectric material 103, conformally depositing conductive material 377, and removing the horizontal portions of conductive material 377. As depicted, FIG. 21 includes the elements of FIG. 20 but with conductive material 277, phase-change material 104 and the two layers of resistive liner replaced by conductive material 377, two layers of phase-change material 204 surrounding a layer of resistive liner 222.

Device structure 2200 provides similar electrical advantages as semiconductor structure 2000 due to the increased contact area of the two layers of phase-change material 204 with conductive material 377 but slightly different or a reduction of the effects of resistance drift that can occur in the amorphous state of phase-change material 204 as previously discussed.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase-change memory device structure comprising:
   a top electrode;
   a phase-change material, wherein the phase-change material is recessed between a top resistive liner material layer and a bottom resistive liner material layer; and
   a conductive material physically contacting:
      a sidewall of the top electrode;
      the phase-change material;
      a top surface of the top resistive liner material layer; and
      a bottom surface of the bottom resistive liner material layer.

2. The phase-change memory device structure of claim 1, further comprising:
   a heater contacting: (i) a bottom electrode and (ii) the bottom resistive liner material layer, wherein the heater is in a first bilayer dielectric; and
   a second bilayer dielectric under the top electrode.

3. The phase-change memory device structure of claim 2, wherein a top dielectric layer of the first bilayer dielectric is recessed under the bottom resistive liner material layer.

4. The phase-change memory device structure of claim 3, wherein a bottom dielectric layer of the second bilayer dielectric is recessed above the top resistive liner material layer.

5. The phase-change memory device structure of claim 1, wherein the top resistive liner material layer and the bottom resistive liner material layer each extend beyond a sidewall of the phase-change material.

6. The phase-change memory device structure of claim 1, wherein the top resistive liner material layer and the bottom resistive liner material layer each include an outer portion surrounded by the conductive material.

7. The phase-change memory device structure of claim 4, wherein a top layer of the first bilayer dielectric and a bottom layer of the second bilayer dielectric are each composed of a same dielectric material.

8. The phase-change memory device structure of claim 7, wherein the top layer of the first bilayer dielectric and the bottom layer of the second bilayer dielectric have a same length.

9. The phase-change memory device structure of claim 4, wherein a bottom layer of the first bilayer dielectric and a top layer of the second bilayer dielectric are each composed of a low-k dielectric material.

10. The phase-change memory device structure of claim 1, wherein the phase-change material has a disk shape.

11. A phase-change memory device structure comprising:
   a heater on a portion of a bottom electrode;
   a first dielectric material around a bottom portion of the heater;
   a second dielectric material around a top portion of the heater, wherein the second dielectric material is recessed;
   a first resistive liner on the second dielectric material;
   a phase-change material recessed on a portion of the first resistive liner;
   a second resistive liner above the phase-change material;
   a third dielectric material on the second resistive liner, wherein the third dielectric material is recessed on the second resistive liner;
   a fourth dielectric material under a top electrode; and
   a conductive material contacting at least a sidewall of the top electrode, the phase-change material, and a portion of a top surface and a bottom surface of the first resistive liner and the second resistive liner.

12. The phase-change memory device structure of claim 11, wherein the second dielectric material and the third dielectric material are recessed with a horizontal length that is less than a horizontal length of the phase-change material.

13. The phase-change memory device structure of claim 11, wherein the second dielectric material and the third dielectric material are each composed of a same dielectric material.

14. The phase-change memory device structure of claim 12, wherein the first resistive liner and the second resistive liner extend beyond a sidewall of the phase-change material.

15. The phase-change memory device structure of claim 13, wherein:
the first resistive liner and the second resistive liner have a same length as the second dielectric material and the third dielectric material; and
the phase-change material has a disk shape.

* * * * *